US012690321B2

(12) United States Patent
Kang et al.

(10) Patent No.: US 12,690,321 B2
(45) Date of Patent: Jul. 21, 2026

(54) DISPLAY DEVICE AND MANUFACTURING METHOD OF THE SAME

(71) Applicant: Samsung Display Co., LTD., Yongin-si (KR)

(72) Inventors: Ki Nyeng Kang, Sejong-si (KR); Guanghai Jin, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 607 days.

(21) Appl. No.: 17/961,077

(22) Filed: Oct. 6, 2022

(65) Prior Publication Data

US 2023/0307581 A1 Sep. 28, 2023

(30) Foreign Application Priority Data

Mar. 23, 2022 (KR) ........................ 10-2022-0036035

(51) Int. Cl.
H10H 29/49 (2025.01)
H10H 29/01 (2025.01)
(Continued)

(52) U.S. Cl.
CPC ............ H10H 29/49 (2025.01); H10H 29/03 (2025.01); H10H 29/032 (2025.01);
(Continued)

(58) Field of Classification Search
CPC . H01L 25/0753; H01L 25/167; H10D 86/441; H10H 20/032; H10H 20/0364;
(Continued)

(56) References Cited

U.S. PATENT DOCUMENTS 11,423,827 B2 8/2022 Kim et al.
2016/0155981 A1* 6/2016 Scharner ................ H10K 71/00
427/58
(Continued)

FOREIGN PATENT DOCUMENTS

KR 10-2012-0138805 12/2012
KR 10-2020-0001657 A 1/2020
(Continued)

*Primary Examiner* — Brent A. Fairbanks
*Assistant Examiner* — Molly K Reida
(74) *Attorney, Agent, or Firm* — Womble Bond Dickinson (US) LLP

(57) ABSTRACT

A display device includes, a substrate; first alignment electrodes disposed on the substrate; second alignment electrodes disposed on the substrate and spaced apart from the first alignment electrodes, respectively; light emitting elements disposed between the first alignment electrodes and the second alignment electrodes; first connection electrodes in contact with first end portions of the light emitting elements and overlapping the first alignment electrodes, respectively; and second connection electrodes in contact with second end portions of the light emitting elements, overlapping the second alignment electrodes, respectively, and spaced apart from the first connection electrodes, respectively. An edge portion of each of the first connection electrodes extends along an edge portion of each of the first alignment electrodes, and an edge portion of each of the second connection electrodes extends along an edge portion of each of the second alignment electrodes.

8 Claims, 22 Drawing Sheets

(51) Int. Cl.

| | |
|---|---|
| *H10H 29/03* | (2025.01) |
| *H10H 29/37* | (2025.01) |
| *H10H 29/80* | (2025.01) |
| *H10H 29/854* | (2025.01) |

(52) U.S. Cl.
CPC ........ *H10H 29/0362* (2025.01); *H10H 29/37* (2025.01); *H10H 29/8321* (2025.01); *H10H 29/8322* (2025.01); *H10H 29/854* (2025.01)

(58) Field of Classification Search
CPC ............. H10H 20/8314; H10H 20/832; H10H 20/857; H10H 29/012; H10H 29/03; H10H 29/032; H10H 29/0364; H10H 29/39; H10H 29/49; H10H 29/8321; H10H 29/8322; H10H 29/142; H10H 29/37; H10H 20/01; H10H 20/831
See application file for complete search history.

(56) References Cited

U.S. PATENT DOCUMENTS

| | | | |
|---|---|---|---|
| 2020/0144453 A1* | 5/2020 | Chang .................. | H10H 20/857 |
| 2022/0085243 A1* | 3/2022 | Chang .................. | H10D 86/021 |
| 2022/0140194 A1 | 5/2022 | Song et al. | |

FOREIGN PATENT DOCUMENTS

| | | |
|---|---|---|
| KR | 10-2020-0088946 | 7/2020 |
| KR | 10-2022-0058756 | 5/2022 |
| WO | 2022/092880 | 5/2022 |

* cited by examiner

RME: RME1, RME2
CNE: CNE1, CNE2
BP: BP1, BP2

RME: RME1, RME2
CNE: CNE1, CNE2
BP: BP1, BP2

SL: ACT1, ACT2
RME: RME1, RME2
CNE: CNE1, CNE2
BP: BP1, BP2

RME: RME1, RME2
CNE: CNE1, CNE2
BP: BP1, BP2

RME: RME1, RME2
BP: BP1, BP2

RME: RME1, RME2
BP: BP1, BP2

RME: RME1, RME2
BP: BP1, BP2

RME: RME1, RME2
BP: BP1, BP2

RME: RME1, RME2
BP: BP1, BP2

RME: RME1, RME2
BP: BP1, BP2
ALN: ASUB, ALNP1, ALNP2

RME: RME1, RME2
BP: BP1, BP2
ALN': ASUB, ALNP'

RME: RME1, RME2
CNE: CNE1, CNE2
BP: BP1, BP2

RME: RME1, RME2
CNE: CNE1, CNE2
BP: BP1, BP2

RME: RME1, RME2
CNE_2: CNE1_2, CNE2_2
BP: BP1, BP2

RME: RME1, RME2
CNE_2: CNE1_2, CNE2_2
BP: BP1, BP2

RME: RME1, RME2
CNE: CNE1, CNE2
BP: BP1, BP2

DISPLAY DEVICE AND MANUFACTURING METHOD OF THE SAME

CROSS-REFERENCE TO RELATED APPLICATION(S)

This application claims priority to and benefits of Korean Patent Application No. 10-2022-0036035 under 35 U.S.C. § 119, filed on Mar. 23, 2022, in the Korean Intellectual Property Office (KIPO), the entire contents of which are incorporated herein by reference.

BACKGROUND

1. Technical Field

Embodiments relate to a display device and a manufacturing method of the display device.

2. Description of the Related Art

The importance of a display device has been increased with the development of multimedia. Accordingly, various types of display devices such as an organic light emitting display (OLED) and a liquid crystal display (LCD) are being widely used.

The display devices are devices for displaying images, and include display panels such as organic light emitting display panels or liquid crystal display panels. An example of the light emitting display panel among the display panels may include a light emitting element such as a light emitting diode (LED), and examples of such a light emitting diode include an organic light emitting diode (OLED) that is formed of an organic material as a fluorescent material, an inorganic light emitting diode that is formed of an inorganic material as a fluorescent material, and the like.

The inorganic light emitting diode, which is formed of an inorganic semiconductor as a fluorescent material, has an advantage in that it has durability even in a high temperature environment, and blue light efficiency thereof is higher than that of the organic light emitting diode.

SUMMARY

Embodiments provide a display device capable of having improved device reliability.

Embodiments provide a manufacturing method of a display device capable of having improved processability and device reliability.

However, embodiments of the disclosure are not limited to those set forth herein. The above and other aspects of the disclosure will become more apparent to one of ordinary skill in the art to which the disclosure pertains by referencing the detailed description of the disclosure given below.

According to an embodiment of the disclosure, a display device may include, a substrate; a plurality of first alignment electrodes disposed on the substrate; a plurality of second alignment electrodes disposed on the substrate and spaced apart from the plurality of first alignment electrodes, respectively; a plurality of light emitting elements disposed between the plurality of first alignment electrodes and the plurality of second alignment electrodes; a plurality of first connection electrodes in contact with first end portions of the plurality of light emitting elements and overlapping the plurality of first alignment electrodes, respectively; and a plurality of second connection electrodes in contact with second end portions of the plurality of light emitting elements, overlapping the plurality of second alignment electrodes, respectively, and spaced apart from the plurality of first connection electrodes, respectively, wherein an edge portion of each of the plurality of first connection electrodes in a plan view may extend an edge portion of each of the plurality of first alignment electrodes in a plan view, and an edge portion of each of the plurality of second connection electrodes in a plan view may extend an edge portion of each of the plurality of second alignment electrodes in a plan view.

In an embodiment, adjacent first alignment electrodes among the plurality of first alignment electrodes are spaced apart from each other with a separation portion, and adjacent first connection electrodes among the plurality of first connection electrodes may be spaced apart from each other by a separation portion.

In an embodiment, an edge portion of each of the plurality of first connection electrodes may be positioned inside of each of the plurality of first alignment electrodes in a plan view, and the edge portion of each of the plurality of first alignment electrodes may be spaced apart from the edge portion of each of the plurality of first connection electrodes by a gap.

In an embodiment, adjacent second alignment electrodes among the plurality of second alignment electrodes may be spaced apart from each other by a separation portion, and adjacent second connection electrodes among the plurality of second connection electrodes may be spaced apart from each other by the separation portion.

In an embodiment, an edge portion of each of the plurality of second connection electrodes may be positioned inside of each of the plurality of second alignment electrodes in a plan view, and the edge portion of each of the plurality of second alignment electrodes may be spaced apart from the edge portion of each of the plurality of second connection electrodes by the gap.

In an embodiment, each of the plurality of first connection electrodes and the plurality of second connection electrodes includes a plurality of metal particles and a crosslinking member disposed between the plurality of metal particles.

In an embodiment, the plurality of metal particles may have magnetism.

In an embodiment, an edge portion of each of the plurality of first connection electrodes may be positioned outside of each of the plurality of first alignment electrodes in a plan view, and the edge portion of each of the plurality of first connection electrodes may be spaced apart from the edge portion of each of the plurality of first alignment electrodes by a gap.

In an embodiment, a planar area of each of the plurality of first connection electrodes may be substantially equal to or smaller than a planar area of each of the plurality of first alignment electrodes in a plan view.

According to an embodiment of the disclosure, a display device may include, a substrate; a first alignment electrode disposed on the substrate; a second alignment electrode disposed on the substrate and spaced apart from the first alignment electrode; a light emitting element disposed between the first alignment electrode and the second alignment electrode; a first connection electrode disposed on the first alignment electrode and in contact with a first end portion of the light emitting element; a second connection electrode disposed on the second alignment electrode, in contact with a second end portion of the light emitting element, and spaced apart from the first connection electrode; and an organic material layer disposed directly on a top surface of at least one of the first connection electrode, the second connection electrode, and the light emitting element.

In an embodiment, each of the first connection electrode and the second connection electrode may include a plurality of metal particles and a crosslinking member disposed between the plurality of metal particles, and the organic material layer and the crosslinking member may include substantially a same material.

In an embodiment, a display device may further include, an inorganic insulating layer disposed on the first connection electrode, the second connection electrode, and the organic material layer.

In an embodiment, the organic material layer may include a plurality of the organic material layers, and each of the plurality of organic material layers may be partially positioned directly on the top surface of at least one of the first connection electrode, the second connection electrode, and the light emitting element.

In an embodiment, the plurality of metal particles may have magnetism.

In an embodiment, the organic material layer may cover the top surface of the first connection electrode, the top surface of the second connection electrode, and the top surface of the light emitting element.

According to an embodiment of the disclosure, a manufacturing method of a display device may include: forming an alignment electrode on a substrate; aligning a light emitting element on the alignment electrode; discharging a solvent, in which a plurality of metal particles may be dispersed, to cover the alignment electrode and the light emitting element may be disposed; and aggregating the plurality of metal particles on the alignment electrode.

In an embodiment, the plurality of metal particles may have magnetism.

In an embodiment, the aggregating of the plurality of metal particles on the alignment electrode may be performed by positioning a magnet pattern part on the alignment electrode, and the plurality of metal particles may be aggregated in a space where the alignment electrode and the magnet pattern part overlap.

In an embodiment, a manufacturing method may further include, after the aggregating of the plurality of metal particles on the alignment electrode, forming a crosslinking member by solidifying the solvent.

In an embodiment, a manufacturing method may further include etching the crosslinking member.

In the display device according to an embodiment, device reliability may be improved.

A manufacturing method of a display device according to an embodiment may provide a display device having improved processability and device reliability.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
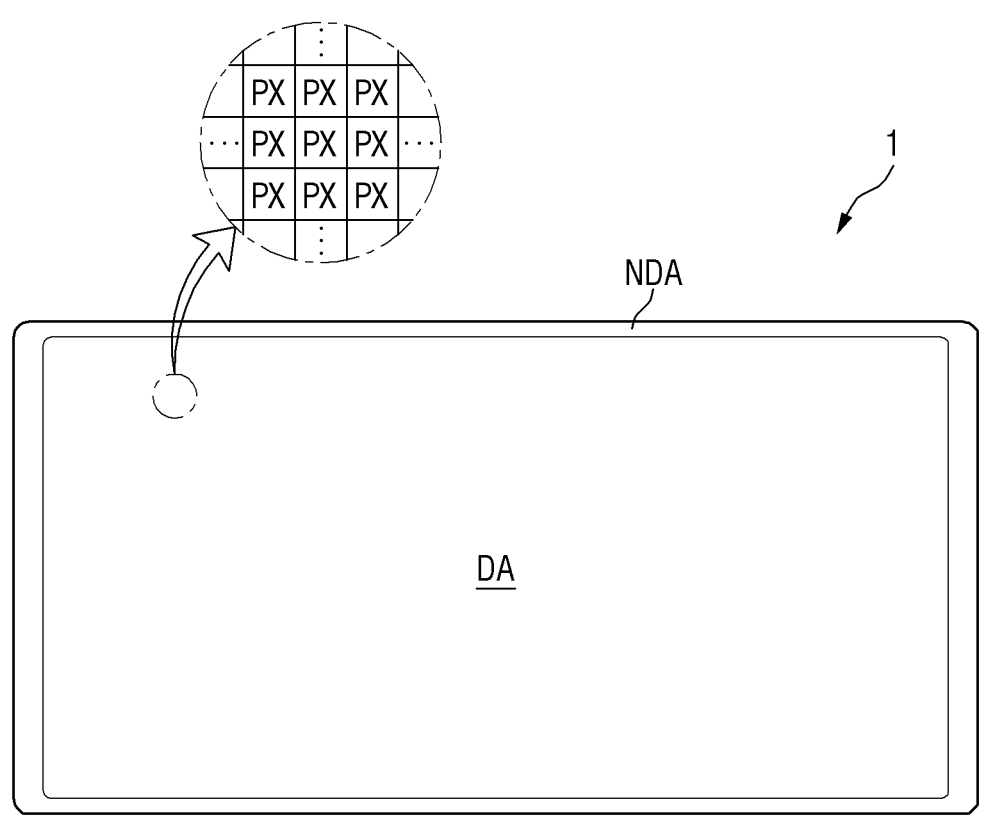
FIG. 1 is a schematic plan view of a display device according to an embodiment.
Figure 1:
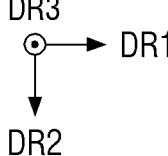

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, specific embodiments will be described with reference to the accompanying drawings.

FIG. 1 is a schematic plan view of a display device according to an embodiment.

In FIG. 1, a first direction DR1, a second direction DR2, and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. The first direction DR1 and the second direction DR2 means horizontal directions intersecting each other. The third direction DR3 means a vertical direction perpendicular to the first direction DR1 and the second direction DR2. In the following specification, unless otherwise specified, the term "direction" may refer to opposite directions toward opposite sides extending along the direction. In case that "directions" extending to opposite sides need to be distinguished from each other, a side will be referred to as "a side in the direction" and another side will be referred to as "another side in the direction". In FIG. 1, an arrow direction will be referred to as a side, and an opposite direction to the arrow direction will be referred to as another side.

Hereinafter, for convenience of description, in referring to surfaces of a display device 1 or each member constituting the display device 1, a surface facing a side in a direction (e.g., the third direction DR3), in which an image is displayed, is referred to as a top surface, and another surface, which is opposite to the surface, is referred to as a bottom surface. However, embodiments are not limited thereto, and the surface and another surface of the member may be referred to as a front surface and a rear surface, respectively, or may also be referred to as a first surface or a second surface. In describing relative positions of the members of the display device 1, a side in the third direction DR3 may be referred to as an upper side and another side opposite to the side in the third direction DR3 may be referred to as a lower side.

Referring to FIG. 1, a display device 1 according to an embodiment may display a moving image or a still image. The display device 1 may refer to all electronic devices including display screens. For example, televisions, laptop computers, monitors, billboards, the Internet of Things (IoT), mobile phones, smartphones, tablet personal computers (PCs), electronic watches, smartwatches, watch phones, head mounted displays, mobile communication terminals, electronic organizers, electronic books, portable multimedia players (PMPs), navigation devices, game machines, digital cameras, camcorders, and the like, which include display screens, may be included in the display device 1.

The display device 1 may include a display panel including a display screen. Examples of the display panel may include an inorganic light emitting diode display panel, an organic light emitting display panel, a quantum dot light emitting display panel, a plasma display panel, a field emission display panel, and the like. Hereinafter, a case in which the inorganic light emitting diode display panel is applied as an example of the display panel will be described by way of example, but embodiments are not limited thereto, and other display panels may be applied thereto.

A shape of the display device 1 may be variously changed or modified. For example, the display device 1 may have a shape such as a rectangle with a long width, a rectangle with a long length, a square, a quadrangle with rounded corners (or vertices), other polygons, or a circle. A shape of a display area DA of the display device 1 may also be similar to an overall shape of the display device 1. In FIG. 1, the display device 1 having a rectangular shape with a long length in the first direction DR1 is illustrated.

The display device 1 may include a display area DA and a non-display area NDA. The display area DA may be an area in which a screen may be displayed, and the non-display area NDA may be an area in which a screen is not displayed. The display area DA may also be referred to as an active area, and the non-display area NDA may also be referred to as a non-active area. The display area DA may occupy the center portion of the display device 1.

The display area DA may include pixels PX. The pixels PX may be arranged in a matrix direction. A shape of each pixel PX may be a rectangular shape or a square shape in a plan view, but embodiments are not limited thereto, and may also be a rhombic shape of which each side is inclined with respect to one direction. Each pixel PX may be arranged in a stripe type or an island type.

Figure 2:
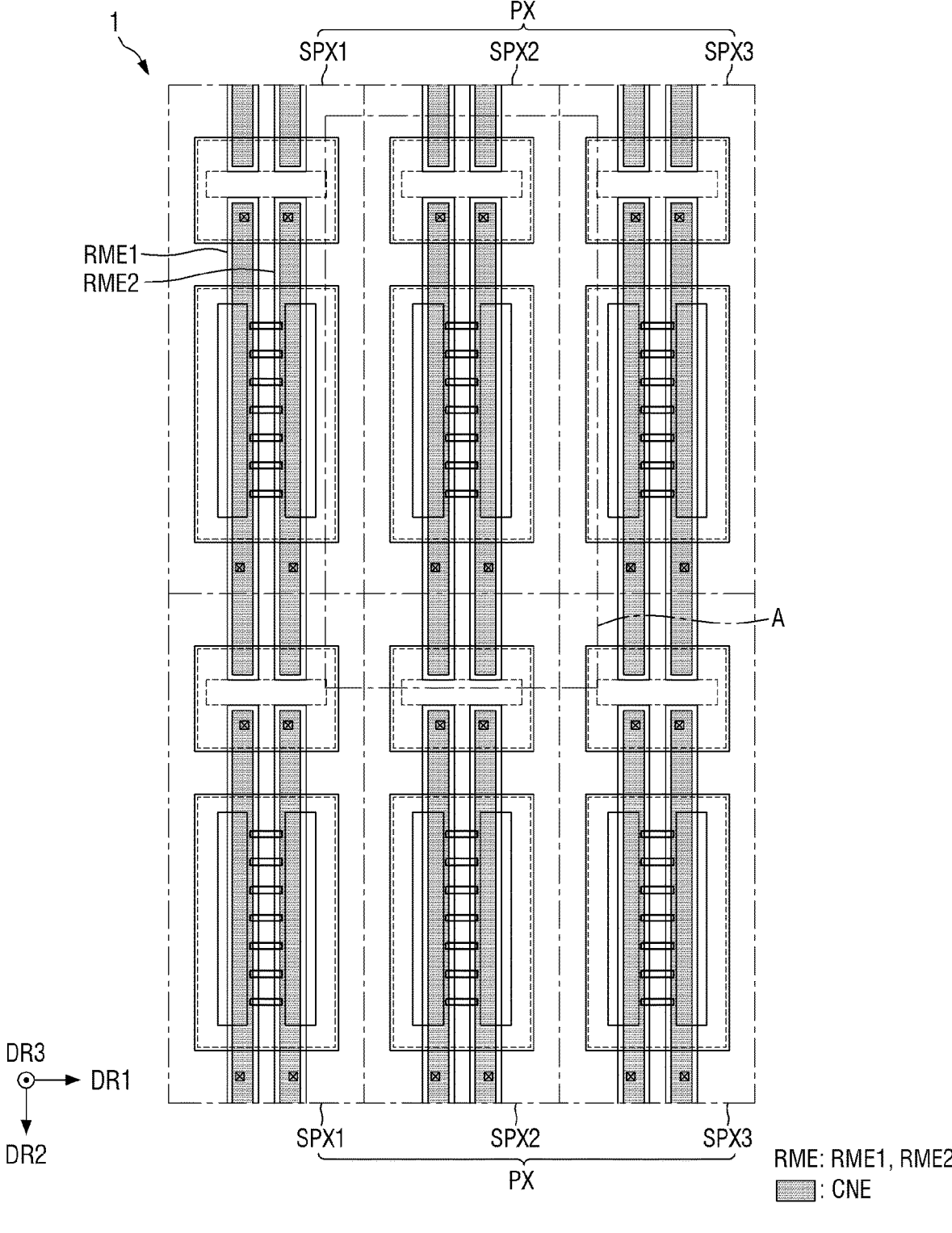
FIG. 2 is a schematic layout view illustrating a pixel arrangement of the display device according to an embodiment.

Each pixel PX may include sub-pixels SPX1, SPX2, and SPX3 (see FIG. 2). Each of the sub-pixels SPX1, SPX2, and SPX3 may include one or more light emitting elements ED (see FIG. 4) emitting light of a specific wavelength band to display a specific color. In some embodiments, the sub-pixels SPX1, SPX2, and SPX3 may include a first sub-pixel SPX1 emitting light of a first color, a second sub-pixel SPX2 emitting light of a second color, and a third sub-pixel emitting light of a third color. The first sub-pixel SPX1 emitting the first color may include a light emitting element ED emitting the first color, the second sub-pixel SPX2 emitting the second color may include a light emitting element ED emitting the second color, and the third sub-pixel SPX3 emitting the third color may include a light emitting element ED emitting the third color, but embodiments are not limited thereto. For example, the first color may be blue, the second color may be green, and the third color may be red. A detailed description of the light emitting element ED will be provided below.

The non-display area NDA may be disposed around (or adjacent to) the display area DA. The non-display area NDA may entirely or partially surround the display area DA. The display area DA may have a rectangular shape, and the non-display area NDA may be adjacent to four sides of the display area DA. The non-display area NDA may constitute a bezel of the display device 1. Lines or circuit drivers included in the display device 1 may be disposed in each of the non-display areas NDA, or external devices may be mounted thereon.

Figure 3:
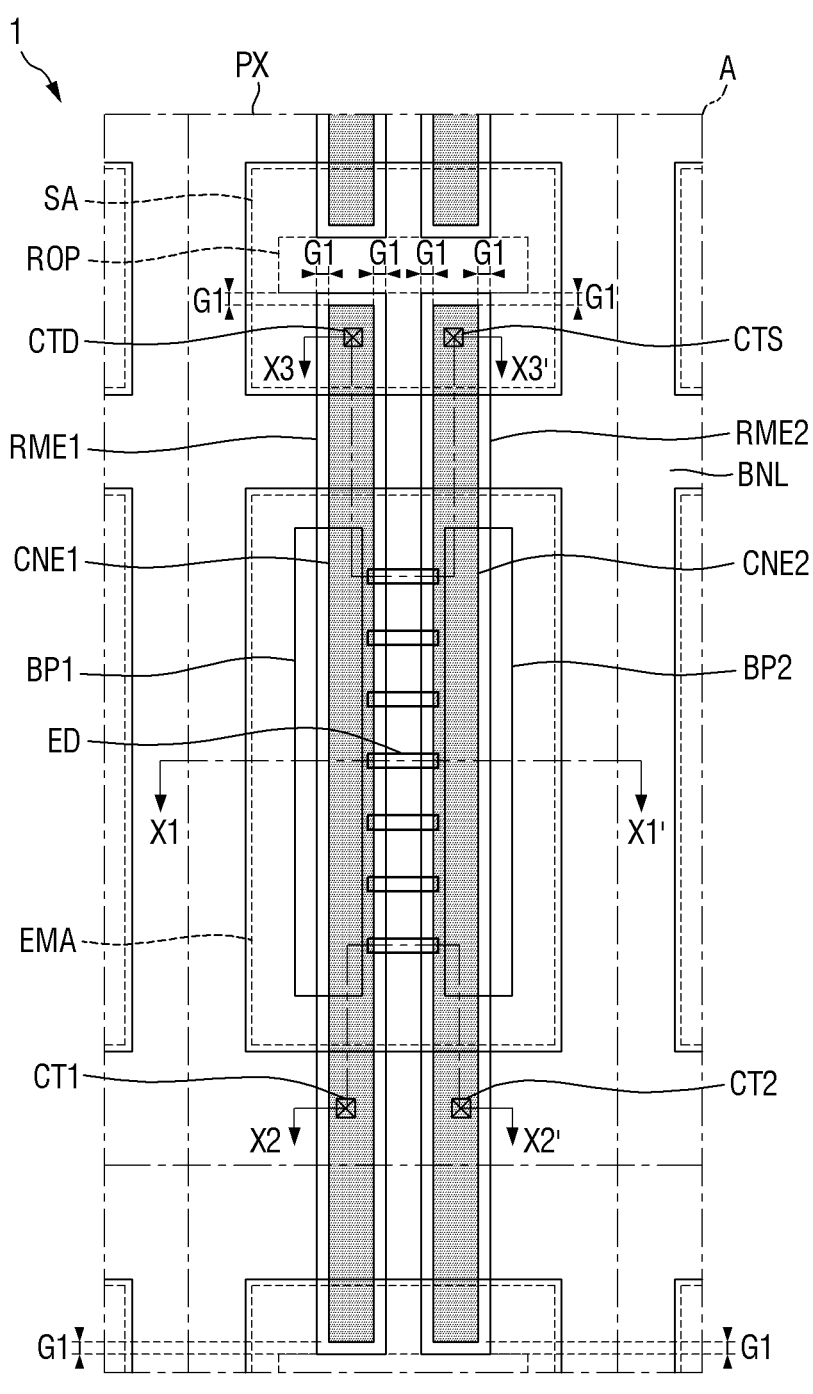
FIG. 3 is a schematic enlarged view of area A of FIG. 2.
Figure 3:
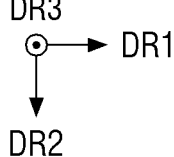

FIG. 2 is a schematic layout view illustrating a pixel arrangement of the display device according to an embodiment. FIG. 3 is a schematic enlarged view of area A of FIG. 2. FIGS. 2 and 3 illustrate a planar arrangement of alignment electrodes RME (e.g., RME1 and RME2), internal banks BP (e.g., BP1 and BP2), an external bank BNL, light emitting elements ED, and connection electrodes CNE (e.g., CNE1 and CNE2) disposed in a pixel PX of the display device 1.

Referring to FIGS. 2 and 3, each of the sub-pixels SPX1, SPX2, and SPX3 of the pixel PX of the display device 1 may include a light emitting area EMA and a non-light emitting area EMA. The light emitting area EMA may be an area in which the light emitting element ED is disposed to emit light of a specific wavelength band. The non-light emitting area may be an area in which the light emitting elements ED are not disposed and light emitted from the light emitting elements ED does not arrive, and thus, the light is not emitted.

The light emitting area EMA may include an area in which the light emitting elements ED are disposed and an area adjacent to the light emitting elements ED, from which light emitted from the light emitting elements ED is emitted. For example, the light emitting area EMA may also include an area in which the light emitted from the light emitting elements ED is reflected or refracted by other members and emitted. Light emitting elements ED may be disposed in each of the sub-pixels SPX1, SPX2, and SPX3, and may form the light emitting area EMA including the area in which the light emitting elements ED are disposed and the area adjacent thereto.

Each of the sub-pixels SPX1, SPX2, and SPX3 may include a sub-area SA disposed in the non-light emitting area EMA. The sub-area SA of the corresponding sub-pixel may be disposed on (or adjacent to) a side of the light emitting area EMA in the second direction DR2. The light emitting area EMA and the sub-area SA may be alternately arranged in the second direction DR2, and the sub-area SA may be disposed between the light emitting areas EMA of different sub-pixels SPX1, SPX2, and SPX3 spaced apart from each other in the second direction DR2. In some embodiments, the light emitting area EMA and the sub-area SA may be alternately arranged in the second direction DR2, and each of the light emitting area EMA and the sub-area SA may be repeatedly arranged in the second direction DR2, but embodiments are not limited thereto.

Since the light emitting element ED is not disposed in the sub-area SA, the light may not be emitted from the sub-area SA, but a portion of the alignment electrode RME disposed in each of the sub-pixels SPX1, SPX2, and SPX3 may be disposed in the sub-area SA. The alignment electrodes RME disposed in different sub-pixels SPX1, SPX2, and SPX3 may be separated from each other in a separation portion ROP of the sub-area SA.

The display device 1 may include alignment electrodes RME (e.g., RME1 and RME2), internal banks BP (e.g., BP1 and BP2), an external bank BNL, light emitting elements ED, and connection electrodes CNE (e.g., CNE1 and CNE2).

The internal banks BP (e.g., BP1 and BP2) may be disposed in the light emitting area EMA of each pixel PX. The internal banks BP may have a specific width in the first direction DR1 and may have a shape extending in the second direction DR2.

For example, the internal banks BP may include a first internal bank BP1 and a second internal bank BP2 that are spaced apart from each other in the first direction DR1 in the light emitting area EMA of each of the sub-pixels SPX1, SPX2, and SPX3. The first internal bank BP1 may be disposed on a side portion (e.g., left portion) in the first direction DR1 from the center portion of the light emitting area EMA, and the second internal bank BP2 may be disposed on another side portion (e.g., right portion) in the first direction DR1 from the center portion of the light emitting area EMA. The first internal bank BP1 and the second internal bank BP2 may be alternately disposed along the first direction DR1 and may be disposed in an island-shaped pattern in the display area DA. The light emitting elements ED may be disposed in a separated space between the first internal bank BP1 and the second internal bank BP2.

A width of the first internal bank BP1 in the first direction DR1 and a width of the second internal bank BP2 in the first direction DR1 may be the same, but embodiments are not limited thereto. A width of the first internal bank BP1 in the second direction DR2 and a width of the second internal bank BP2 in the second direction DR2 may be the same, but may be smaller than a width of the light emitting area EMA surrounded by the external bank BNL in the second direction DR2. In some embodiments, the first internal bank BP1 and the second internal bank BP2 may be spaced apart from a portion of the external bank BNL extending in the first direction DR1, but embodiments are not limited thereto.

The alignment electrodes RME (e.g., RME1 and RME2) may be disposed for each of the sub-pixels SPX1, SPX2, and SPX3 in a shape extending in a direction. The alignment electrodes RME may extend in the second direction DR2 to be disposed in the light emitting area EMA and the sub-area SA of each of the sub-pixels SPX1, SPX2, and SPX3, and may be spaced apart from each other in the first direction DR1. The alignment electrodes RME may be connected (e.g., electrically connected) to a light emitting element ED to be described below.

The alignment electrodes RME may include a first alignment electrode RME1 and a second alignment electrode RME2. The first alignment electrode RME1 may be disposed on a side portion (e.g., a left portion) in the first direction DR1 from the center portion of the light emitting area EMA, and the second alignment electrode RME2 may be disposed on another side portion (e.g., the right portion) in the first direction DR1 from the center portion of the light emitting area EMA. The first alignment electrode RME1 may be disposed on the first internal bank BP1, and the second alignment electrode RME2 may be disposed on the second internal bank BP2. The first alignment electrode RME1 and the second alignment electrode RME2 may pass through the external bank BNL to be partially disposed in the light emitting area EMA and the sub-area SA of the corresponding sub-pixel. The first alignment electrodes RME1 and the second alignment electrodes RME2 of different sub-pixels SPX1, SPX2, and SPX3 may be spaced apart from each other based on the separation portion ROP positioned in the sub-area SA of any one sub-pixel.

For example, the two alignment electrodes RME may have a shape extending in the second direction DR2 for each of the sub-pixel SPX1, SPX2, and SPX3, but embodiments are not limited thereto. For example, the display device 1 may also have a shape in which a larger number of the alignment electrodes RME are disposed in a sub-pixel or the alignment electrodes RME are partially bent and have different widths according to positions thereof.

A width of the first alignment electrode RME1 in the first direction DR1 and a width of the second alignment electrode RME2 in the first direction DR1 may be the same, but embodiments are not limited thereto. The width of the first alignment electrode RME1 in the first direction DR1 and the width of the second alignment electrode RME2 in the first direction DR1 are the same, but may be greater than a width of the light emitting area EMA surrounded by the external bank BNL in the second direction DR2. In some embodiments, the first alignment electrode RME1 and the second alignment electrode RME2 may pass through the external bank BNL surrounding sides (e.g., opposite sides) of the light emitting area EMA in the second direction DR2 to be extended to the separation portions ROP inside the sub-areas SA disposed on sides (e.g., opposite sides) of the light emitting area EMA in the second direction DR2, but embodiments are not limited thereto.

The external bank BNL may surround the sub-pixels SPX1, SPX2, and SPX3 or the light emitting area EMA and the sub-area SA. The external bank BNL may be disposed at a boundary area between the sub-pixels SPX1, SPX2, and SPX3 adjacent in the first direction DR1 and the second direction DR2, and may also be disposed at a boundary area between the light emitting area EMA and the sub-area SA. A gap (or space) between the light emitting areas EMA and the sub-areas SA of each of the sub-pixels SPX1, SPX2, and SPX3 may vary according to a width of the external bank BNL.

The external bank BNL may be disposed in a grid pattern on an entire surface of the display area DA by forming portions extending in the first direction DR1 and the second direction DR2 in a plan view. The sub-pixels SPX1, SPX2, and SPX3, the light emitting area EMA, and the sub-area SA of the display device 1 may be areas divided by an arrangement of the external bank BNL. For example, the external bank BNL may be disposed across the boundary of each sub-pixel SPX1, SPX2, and SPX3 to divide the sub-pixels adjacent to each other, and may surround the light emitting area EMA and the sub-area SA disposed in each of the sub-pixels SPX1, SPX2, and SPX3 to divide the light emitting area EMA and the sub-area SA.

The light emitting elements ED may be disposed in the light emitting area EMA. For example, the light emitting elements ED may be disposed in the separated space between the first internal bank BP1 and the second internal bank BP2. The light emitting elements ED may be arranged to be spaced apart from each other in the second direction DR2. In an embodiment, the light emitting elements ED may have a shape extending in a direction, and have end portions (e.g., opposite ends) disposed on different alignment electrodes RME. A width of the light emitting element ED in the first direction DR1 may be greater than a width of a separated space between the first alignment electrode RME1 and the second alignment electrode RME2 in the first direction DR1. The light emitting elements ED may have an extending direction arranged to be substantially perpendicular to the second direction DR2 in which the alignment electrodes RME extend, but embodiments are not limited thereto. For example, the extending direction of the light emitting element ED may face the first direction DR1 or a direction obliquely inclined to the first direction DR1. A detailed description of a structure of the light emitting element ED will be described below with reference to FIG. 4.

The connection electrodes CNE (e.g., CNE1 and CNE2) may be disposed on the alignment electrodes RME and the internal banks. The connection electrodes CNE may each have a shape extending in a direction, and may be spaced apart from each other in the first direction DR1. Each of the connection electrodes CNE may be in contact with the light emitting element ED and may be connected (e.g., electrically connected) to the alignment electrode RME or a circuit layer CCL (see FIG. 5) on a lower side of the alignment electrode RME.

The connection electrodes CNE may include a first connection electrode CNE1 and a second connection electrode CNE2 disposed in each of the sub-pixels SPX1, SPX2, and SPX3. The first connection electrode CNE1 may be disposed on a side portion (e.g., a left portion) in the first direction DR1 from the center portion of the light emitting area EMA, and the second connection electrode CNE2 may be disposed on another side portion (e.g., aa right portion) in the first direction DR1 from the center portion of the light emitting area EMA.

The first connection electrode CNE1 may have a shape extending in the second direction DR2 and may be disposed on the first alignment electrode RME1 or the first internal bank BP1. The first connection electrode CNE1 may overlap (e.g., partially overlap) the first alignment electrode RME1 and may extend in a direction from the light emitting area EMA to the sub-area SA along the external bank BNL.

The second connection electrode CNE2 may have a shape extending in the second direction DR2 and may be disposed on the second alignment electrode RME2 or the second internal bank BP2. The second connection electrode CNE2 may overlap (e.g., partially overlap) the second alignment electrode RME2 and may extend in a direction from the light emitting area EMA to the sub-area SA along the external bank BNL.

As illustrated in FIGS. 2 and 3, the first connection electrodes CNE1 and the first alignment electrodes RME1 may have substantially the same profile (or the same shape) in a plan view except for the gap G1 therebetween. For example, the first connection electrode CNE1 may be disposed on the first alignment electrode RME1 to extend in substantially the same shape as an extended shape of the first alignment electrode RME1. For example, an edge portion (e.g., a left edge portion, a right edge portion, an upper edge portion, a lower edge portion) of each of the first connection electrodes CNE1 in a plan view may extend along an edge portion (e.g., a left edge portion, a right edge portion, an upper edge portion, and/or a lower edge portion) of each of the first alignment electrodes RME1 in a plan view. For example, similarly that the first alignment electrode RME1 of a sub-pixel has a profile (or a shape) that is spaced apart from the first alignment electrode RME1 of another sub-pixel adjacent thereto in the second direction DR2 in the second direction DR2 with the separation portion ROP interposed therebetween, the first connection electrode CNE1 of a sub-pixel may be spaced apart from the first connection electrode CNE1 of another sub-pixel adjacent thereto in the second direction DR2 in the second direction DR2 with the separation portion ROP therebetween.

For example, a profile shape of the first connection electrode CNE1 and a profile shape of the first alignment electrode RME1 may be substantially same in a plan view. In another example, in case that the first alignment electrode RME1 has a profile of, for example, a T-shape in a plan view rather than a shape extending in a direction, the profile of the first connection electrode CNE1 and the first alignment electrode RME1 may have substantially the same profile of the T-shape in a plan view.

As illustrated in FIG. 3, an edge portion of the first connection electrode CNE1 may be spaced apart from an edge portion of the first alignment electrode RME1 to the inside of the first alignment electrode RME1 with maintaining a specific gap in a plan view. For example, a side surface of the first connection electrode CNE1 in the first direction DR1 may be spaced apart from a side surface of the first alignment electrode RME1 in the first direction DR1 by a gap G1 toward another side in the first direction DR1, another side surface of the first connection electrode CNE1 in the first direction DR1 may be spaced apart from another side surface of the first alignment electrode RME1 in the first direction DR1 by the gap G1 toward a side in the first direction DR1, a side surface of the first connection electrode CNE1 in the second direction DR2 may be spaced apart from a side surface of the first alignment electrode RME1 in the second direction DR2 by the gap G1 toward another side in the second direction DR2, and another side surface of the first connection electrode CNE1 in the second direction DR2 may be spaced apart from another side surface of the first alignment electrode RME1 in the second direction DR2 by the gap G1 toward a side in the second direction DR2.

Likewise, as illustrated in FIGS. 2 and 3, the second connection electrodes CNE2 and the second alignment electrodes RME2 may have substantially the same profile (or the same shape) in a plan view except for the gap G1 therebetween. For example, the second connection electrode CNE2 may be disposed on the second alignment electrode RME2. For example, the second connection electrode CNE2 and the second alignment electrode RME2 may extend in substantially the same shape. For example, an edge portion (e.g., left edge, right edge, upper edge, and/or lower edge portions) of each of the plurality of second connection electrodes CNE2 in a plan view may extend along an edge portion (e.g., a left edge portion, a right edge portion, an upper edge portion, and/or a lower edge portion) of each of the plurality of second alignment electrodes in the second direction DR2 in a plan view. For example, similarly that the second alignment electrode RME2 of a sub-pixel has a profile that is spaced apart from the second alignment electrode RME2 of another sub-pixel adjacent thereto in the second direction DR2 in the second direction DR2 with the separation portion ROP interposed therebetween, the second connection electrode CNE2 of a sub-pixel may be spaced apart from the second connection electrode CNE2 of another sub-pixel adjacent thereto in the second direction DR2 with the separation portion ROP therebetween.

For example, a profile shape of the second connection electrode CNE2 and a profile shape of the second alignment electrode RME2 may be substantially same in a plan view. In another example, in case that the second alignment electrode RME2 has a profile of, for example, a 'I'-shape in a plan view rather than a shape extending in a direction, the profile of the second connection electrode CNE2 and the second alignment electrode RME2 may have substantially the same profile of the T-shape in a plan view.

As illustrated in FIG. 3, an edge portion of the second connection electrode CNE2 may be spaced apart from an edge portion of the second alignment electrode RME2 to the inside of the second alignment electrode RME2 with maintaining a specific gap in a plan view. For example, a side surface of the second connection electrode CNE2 in the first direction DR1 may be spaced apart from a side surface of the second alignment electrode RME2 in the first direction DR1 by a gap G1 toward another side in the first direction DR1, another side surface of the second connection electrode CNE2 in the first direction DR1 may be spaced apart from another side surface of the second alignment electrode RME2 in the first direction DR1 by the gap G1 toward a side in the first direction DR1, a side surface of the second connection electrode CNE2 in the second direction DR2 may be spaced apart from a side surface of the second alignment electrode RME2 in the second direction DR2 by the gap G1 toward another side in the second direction DR2, and another side surface of the second connection electrode CNE2 in the second direction DR2 may be spaced apart from another side surface of the second alignment electrode RME2 in the second direction DR2 by the gap G1 toward a side in the second direction DR2.

The profile of the first and second connection electrodes CNE1 and CNE2 in a plan view as described above may be a result of a manufacturing method of a display device to be described below. A detailed description thereof will be provided below. Hereinafter, a structure of the light emitting element ED will be described.

Figure 4:
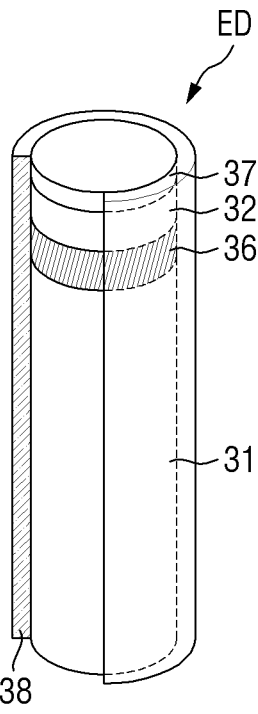
FIG. 4 is a schematic structural view illustrating a structure of a light emitting element of the display device according to an embodiment.

FIG. 4 is a schematic structural view illustrating a structure of a light emitting element of the display device according to an embodiment.

Referring to FIG. 4, the light emitting element ED may be a light emitting diode. For example, the light emitting element ED may be an inorganic light emitting diode having a size of nanometers to micrometers and made of an inorganic material. The light emitting element ED may be aligned between two electrodes in which polarities are formed in case that an electric field is formed in a specific direction between the two electrodes facing each other.

The light emitting element ED according to an embodiment may have a shape extending in a direction. In some embodiments, the light emitting element ED may have a shape such as a cylinder, a rod, a wire, or a tube, but embodiments are not limited thereto.

The light emitting element ED may include a semiconductor layer 30 doped with an arbitrary conductive (e.g., p-type or n-type) dopant. The semiconductor layer 30 may receive an electrical signal applied from an external power source to emit light of a specific wavelength band. The light emitting element ED may include a first semiconductor layer 31, a second semiconductor layer 32, a light emitting layer 36, an electrode layer 37, and an insulating layer 38.

The first semiconductor layer 31 of the light emitting element ED may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, and $0 \leq x+y \leq 1$). For example, the semiconductor material of the first semiconductor layer 31 may be one or more of AlGaInN, GaN, AlGaN, InGaN, AlN, and InN doped with an n-type dopant. The n-type dopant doped in the first semiconductor layer 31 may be Si, Ge, Sn, or the like.

The second semiconductor layer 32 of the light emitting element ED may be disposed on the first semiconductor layer 31 with the light emitting layer 36 interposed therebetween. The second semiconductor layer 32 may be a p-type semiconductor, and may include a semiconductor material having a chemical formula of $Al_xGa_yIn_{1-x-y}N$ ($0 \leq x \leq 1$, $0 \leq y$ 1, and $0 \leq x+y \leq 1$). For example, the semiconductor material of the second semiconductor layer 32 may be one or more of AlGaInN, GaN, AlGaN, InGaN, AlN, and InN doped with a p-type dopant. The p-type dopant doped in the second semiconductor layer 32 may be Mg, Zn, Ca, Ba, or the like.

For example, each of the first semiconductor layer 31 and the second semiconductor layer 32 may be a single layer, but embodiments are not limited thereto. The first semiconductor layer 31 and the second semiconductor layer 32 may further include a larger number of layers, for example, a clad layer or a tensile strain barrier reducing (TSBR) layer, according to a material of the light emitting layer 36.

The light emitting layer 36 of the light emitting element ED may be disposed between the first semiconductor layer 31 and the second semiconductor layer 32. The light emitting layer 36 may include a material having a single or multiple quantum well structure. In case that the light emitting layer 36 includes the material having the multiple quantum well structure, the light emitting layer 36 may have a structure in which quantum layers and well layers are alternately stacked. The light emitting layer 36 may emit light by a combination of electron-hole pairs according to electrical signals applied through the first semiconductor layer 31 and the second semiconductor layer 32. The light emitting layer 36 may include a material such as AlGaN, AlGaInN, InGaN, or the like. For example, in case that the light emitting layer 36 has the multiple quantum well structure (i.e., the structure in which the quantum layers and the well layers are alternately stacked), the quantum layers may include a material such as AlGaN or AlGaInN, and the well layers may include a material such as GaN or AlInN.

The light emitting layer 36 may also have a structure in which semiconductor materials having large band gap energy and semiconductor materials having small band gap energy are alternately stacked, and may also include other Group III to Group V semiconductor materials according to a wavelength band of emitted light. The light emitted by the light emitting layer 36 is not limited to light of a blue wavelength band, and in some cases, the light emitting layer 36 may also emit light of red and green wavelength bands.

The electrode layer 37 of the light emitting element ED may be an Ohmic connection electrode CNE. However, the light emitting element ED is not limited thereto, and may be a Schottky connection electrode CNE. The light emitting element ED may include at least one electrode layer 37. The light emitting element ED may include one or more electrode layers 37, but embodiments are not limited thereto, and the electrode layers 37 may also be omitted.

The electrode layer 37 may decrease resistance between the light emitting element ED and the electrode or the connection electrode CNE in case that the light emitting element ED is connected (e.g., electrically connected) to the electrode or the connection electrode CNE in the display device 1. The electrode layer 37 may include a metal having conductivity. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO).

The insulating layer 38 of the light emitting element ED may protect the semiconductor layers and the electrode layer of the light emitting element ED. The insulating layer 38 may prevent an electrical short (e.g., a short circuit) that may occur in the light emitting layer 36 in case that the light emitting element ED is in direct contact with an electrode through which an electrical signal is transmitted. For example, the insulating layer 38 may prevent a decrease in luminous efficiency of the light emitting element ED.

The insulating layer 38 may be surround outer surfaces of the semiconductor layers and the electrode layers described above. For example, the insulating layer 38 may be surround at least an outer surface of the light emitting layer 36, but may be formed to expose end portions (e.g., opposite end portions) of the light emitting element ED in a length direction. For example, the insulating layer 38 may also be formed so that a top surface thereof may be rounded in cross section in an area adjacent to at least one end portion of the light emitting element ED.

The insulating layer 38 may include materials having insulating properties, for example, at least one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). For example, the insulating layer 38 may be formed as a single layer, but embodiments are not limited thereto, and in some embodiments, the insulating layer 38 may also be formed in a multilayer structure in which layers are stacked.

Hereinafter, a stacking relationship of each member of the display device 1 will be described.

Figure 5:
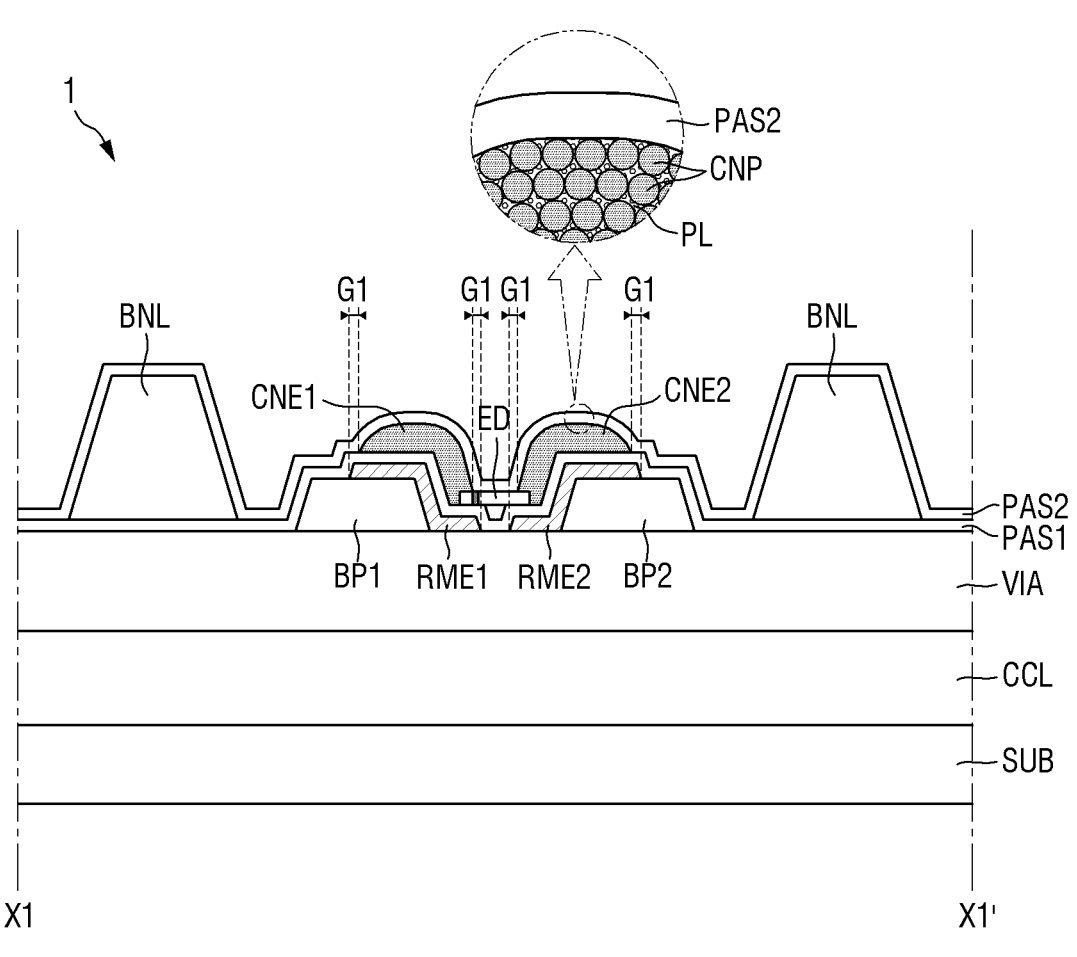
FIG. 5 is a schematic cross-sectional view illustrating a cross section taken along line X1-X1' of FIG. 3.
Figure 5:
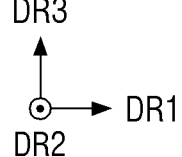
Figure 6:
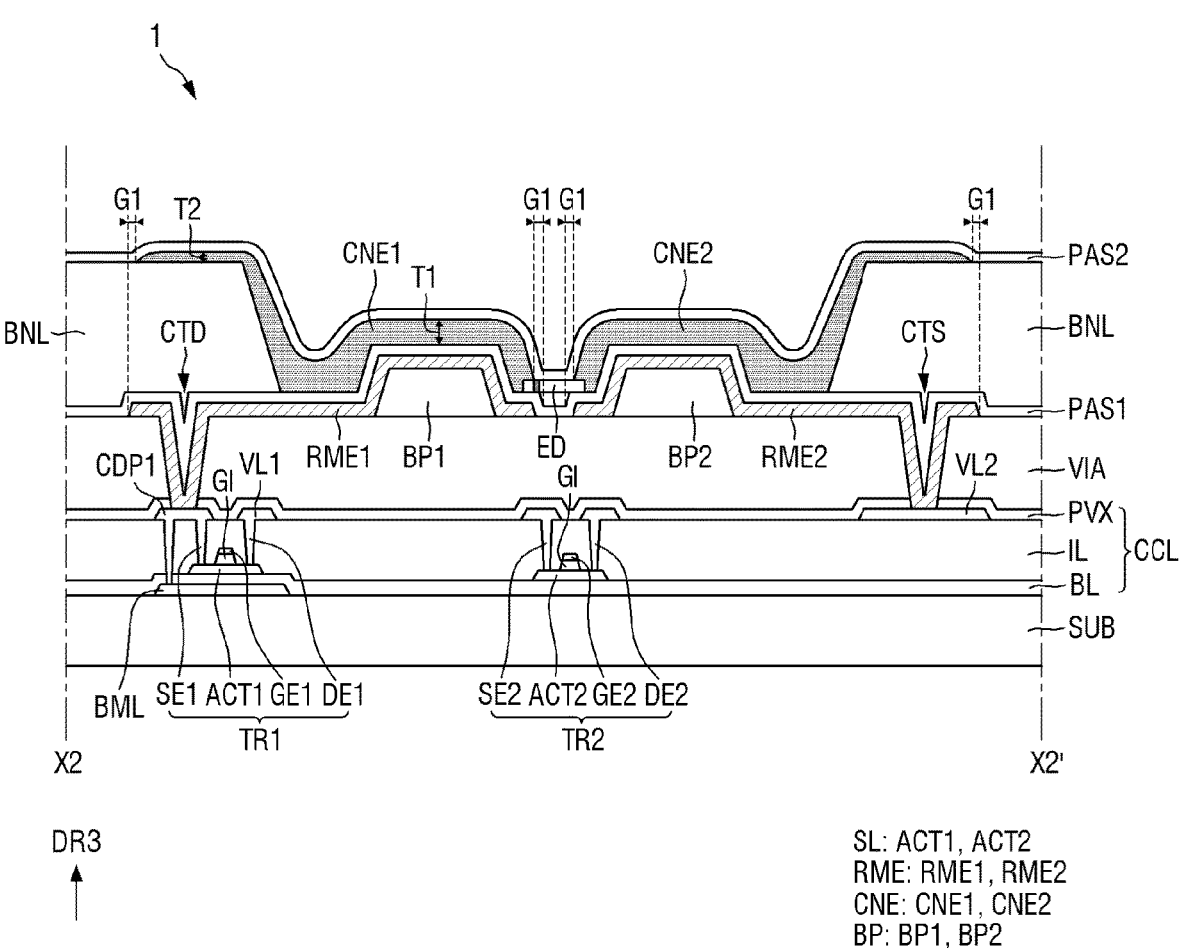
FIG. 6 is a schematic cross-sectional view illustrating a cross section taken along line X2-X2' of FIG. 3.
Figure 7:
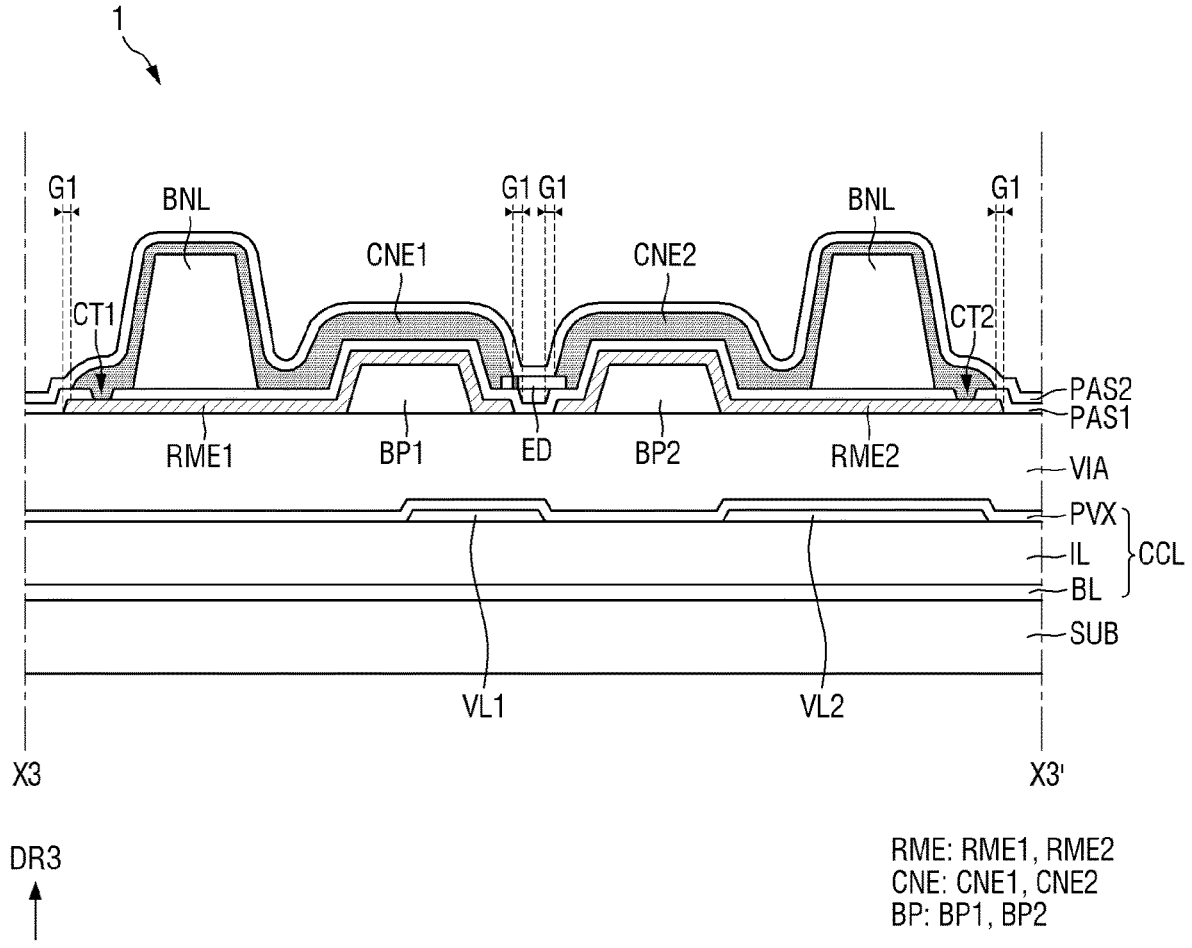
FIG. 7 is a schematic cross-sectional view illustrating a cross section taken along line X3-X3' of FIG. 3.
Figure 8:
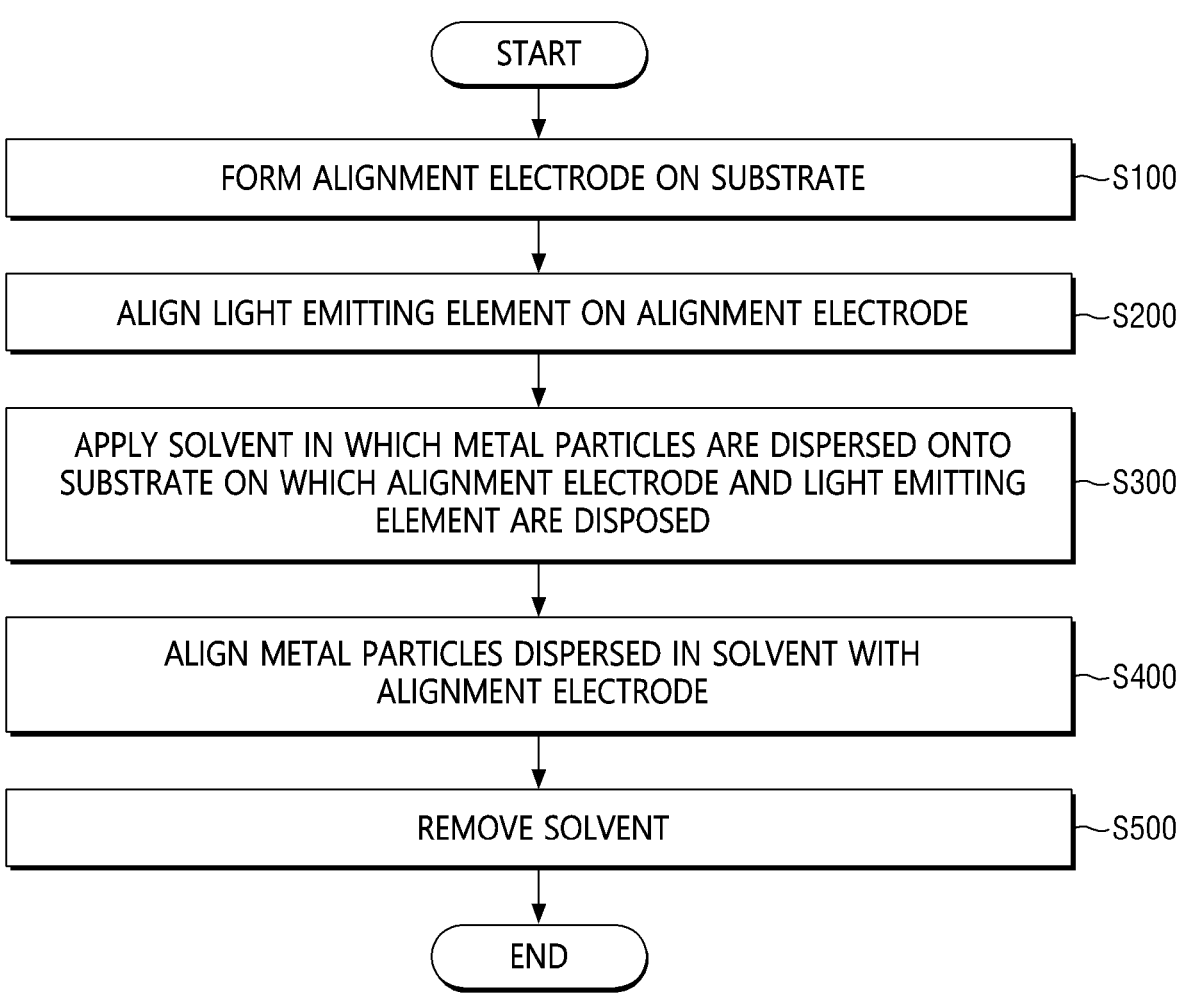
FIGS. 8 to 17 are schematic views for describing a manufacturing method of a display device according to an embodiment.

FIG. 5 is a schematic cross-sectional view illustrating a cross section taken along line X1-X1' of FIG. 3. FIG. 6 is a schematic cross-sectional view illustrating a cross section taken along line X2-X2' of FIG. 3. FIG. 7 is a schematic cross-sectional view illustrating a cross section taken along line X3-X3' of FIG. 3.

Referring to FIGS. 5 to 7, the display device 1 may include a substrate SUB, and a semiconductor layer SL, conductive layers, and insulating layers disposed on the substrate SUB. For example, the display device 1 may include alignment electrodes RME, a light emitting element ED, and a connection electrode CNE. Each of the semiconductor layer SL, the conductive layers, and the insulating layers may constitute a circuit layer CCL of the display device 1.

The substrate SUB may be made of an insulating material such as glass, quartz, or a polymer resin. For example, the substrate SUB may be a rigid substrate SUB, but may also be a flexible substrate SUB that may be bent, folded, or rolled.

A circuit layer CCL may be disposed on the substrate SUB. Various lines that transmit electrical signals to the light emitting element ED disposed on the substrate SUB may be disposed on the circuit layer CCL. As illustrated in FIGS. 5 and 7, the circuit layer CCL may include a first conductive layer, a semiconductor layer SL, a second conductive layer, and a third conductive layer as conductive layers, and may include a buffer layer BL, a first gate insulating layer GI, an interlayer insulating layer IL, and a circuit protection layer PVX as insulating layers.

The first conductive layer may be disposed on the substrate SUB. The first conductive layer may include a lower metal layer BML, and the lower metal layer BML, may overlap a first active layer ACT1 of a first transistor TR1. The lower metal layer BML may function to prevent light from being incident on the first active layer ACT1 of the first transistor TR1 or stabilizing electrical characteristics of the first transistor TR1 by being connected (e.g., electrically connected) to the first active layer ACT1. In another example, the lower metal layer BML may be omitted.

The buffer layer BL may be disposed on the lower metal layer BML and the substrate SUB. The buffer layer BL may be formed on the substrate SUB to protect transistors of the pixel PX from moisture permeating through the substrate SUB vulnerable to moisture permeation, and may perform a surface planarization function.

The semiconductor layer SL may be disposed on the buffer layer BL. The semiconductor layer SL may include the first active layer ACT1 of the first transistor TR1 and a second active layer ACT2 of a second transistor TR2. The first active layer ACT1 and the second active layer ACT2 may respectively overlap (e.g., partially overlap) a first gate electrode GE1 and a second gate electrode GE2 of a second conductive layer, which will be described below.

The semiconductor layer SL may include polycrystalline silicon, single crystal silicon, an oxide semiconductor, or the like. In another example, the semiconductor layer SL may also include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

For example, a first transistor TR1 and the second transistor TR2 may be disposed in the pixel PX of the display device 1, but embodiments are not limited thereto and the display device 1 may include a larger number of transistors.

The first gate insulating layer GI may be disposed on the semiconductor layer SL in the display area DA. The first gate insulating layer GI may function as a gate insulating layer of each of the first and second transistors TR1 and TR2. For example, the first gate insulating layer GI may be patterned together with gate electrodes GE1 and GE2 of a second conductive layer to be described below, and may be disposed (e.g., partially disposed) between the second conductive layer and the active layers ACT1 and ACT2 of the semiconductor layer SL. However, embodiments are not limited thereto. In some embodiments, the first gate insulating layer GI may be disposed (e.g., entirely disposed) on the buffer layer BL.

The second conductive layer may be disposed on the first gate insulating layer GI. The second conductive layer may include the first gate electrode GE1 of the first transistor TR1 and the second gate electrode GE2 of the second transistor TR2. The first gate electrode GE1 may overlap a channel area of the first active layer ACT1 in a third direction DR3, which is a thickness direction, and the second gate electrode GE2 may overlap a channel area of the second active layer ACT2 in the third direction DR3 (e.g., the thickness direction).

The interlayer insulating layer IL may be disposed on the second conductive layer. The interlayer insulating layer IL may function as an insulating layer between the second conductive layer and other layers disposed thereon and may protect the second conductive layer.

The third conductive layer may be disposed on the interlayer insulating layer IL. The third conductive layer may include a first voltage line VL1 and a second voltage line VL2, a first conductive pattern CDP1, and source electrodes SE1 and SE2 and drain electrodes DE1 and DE2 of each of the first and second transistors TR1 and TR2 disposed in the display area DA.

A high potential voltage (e.g., a first power voltage) transferred to the first alignment electrode RME1 may be applied to the first voltage line VL1, and a low potential voltage (e.g., a second power voltage) transferred to the second alignment electrode RME2 may be applied to the second voltage line VL2. A portion of the first voltage line VL1 may be in contact with the first active layer ACT1 of the first transistor TR1 through a contact hole penetrating through the interlayer insulating layer IL. The first voltage line VL1 may function as a first drain electrode DE1 of the first transistor TR1. The second voltage line VL2 may be directly connected to the second alignment electrode RME2.

The first conductive pattern CDP1 may be in contact with the first active layer ACT1 of the first transistor TR1 through a contact hole penetrating through the interlayer insulating layer IL. The first conductive pattern CDP1 may be in contact with the lower metal layer BML through another contact hole penetrating through the interlayer insulating layer IL and the buffer layer BL. The first conductive pattern CDP1 may function as a first source electrode SE1 of the first transistor TR1. For example, the first conductive pattern CDP1 may be connected to a first alignment electrode RME1 or a first connection electrode CNE1 to be described below. The first transistor TR1 may transfer the first power voltage applied from the first voltage line VL1 to the first alignment electrode RME1 or the first connection electrode CNE1.

Each of a second source electrode SE2 and a second drain electrode DE2 may be in contact with the second active layer ACT2 of the second transistor TR2 through a contact hole penetrating through the interlayer insulating layer IL.

The circuit protection layer PVX may be disposed on the third conductive layer. The circuit protection layer PVX may function as an insulating layer between the third conductive layer and other layers and may protect the third conductive layer.

The buffer layer BL, the first gate insulating layer GI, the interlayer insulating layer IL, and the circuit protection layer PVX described above may be formed of inorganic layers alternately stacked. For example, the buffer layer BL, the first gate insulating layer GI, the interlayer insulating layer IL, and the circuit protection layer PVX may be formed of a double layer in which an inorganic layer including at least one of silicon oxide ($SiO_x$), silicon nitride ($SiN_x$), and silicon oxynitride ($SiO_xN_y$) may be stacked, or multiple layers in which these layers are alternately stacked.

A via insulating layer VIA may be disposed on the circuit layer CCL. For example, the via insulating layer VIA may be disposed on the circuit protection layer PVX of the circuit layer CCL. The via insulating layer VIA may include an organic insulating material, for example, an organic insulating material such as polyimide, to compensate for a step caused by various lines inside the circuit layer CCL and to form a flat top surface.

An internal bank BP may be disposed on the top surface of the via insulating layer VIA. For example, the via insulating layer VIA and the internal bank BP may be in contact with (e.g., in direct contact with) each other.

The internal banks BP may be disposed on the via insulating layer VIA. For example, the internal banks BP may be disposed (e.g., directly disposed) on the via insulating layer VIA, and may have a structure in which at least a portion thereof protrudes from the top surface of the via insulating layer VIA. The protruding portion of the internal bank BP may have an inclined or curved side surface at a certain curvature, and light emitted from the light emitting element ED may be reflected from the alignment electrode RME disposed on the internal bank BP to be emitted in a side in the third direction DR3. The internal banks BP may include an organic insulating material such as polyimide, but embodiments are not limited thereto.

The alignment electrodes RME may be disposed on the internal banks BP1 and BP2 and the via insulating layer VIA. The first alignment electrode RME1 may extend in a direction toward the second internal bank BP2 (e.g., a right direction), and the second alignment electrode RME2 may extend in a direction toward the first internal bank BP1 (e.g., a left direction). The first alignment electrode RME1 may be disposed on at least the inclined side surface of the first internal bank BP1 and the top surface of the via insulating layer VIA disposed in a separation space between the first internal bank BP1 and the second internal bank BP2, and the second alignment electrode RME2 may be disposed on at least the inclined side surface of the second internal bank BP2 and the top surface of the via insulating layer VIA disposed in the separation space between the first internal bank BP1 and the second internal bank BP2.

A gap between the first alignment electrode RME1 and the second alignment electrode RME2 in the first direction DR1 may be smaller than a gap between the first internal bank BP1 and the second internal bank BP2, e.g., in a plan view. At least a partial area of the first alignment electrode RME1 and the second alignment electrode RME2 may be disposed (e.g., directly disposed) on the via insulating layer VIA so that the first alignment electrode RME1 and the second alignment electrode RME2 may be disposed on the same plane.

The light emitting element ED disposed between the internal banks BP may emit light in direction of end portions (e.g., opposite end portions) thereof, and the emitted light may be directed to the alignment electrode RME disposed on the internal bank. Accordingly, the light emitted from the light emitting element ED may be reflected by the alignment electrode RME and emitted in the third direction DR3.

As illustrated in FIG. 6, each of the alignment electrodes RME may be in contact with (e.g., in direct contact with) the third conductive layer through electrode contact holes CTD and CTS at a portion overlapping the external bank BNL. A first electrode contact hole CTD may be formed in an area where the external bank BNL and the first alignment electrode RME1 overlap, and a second electrode contact hole CTS may be formed in an area where the external bank BNL and the second alignment electrode RME2 overlap. The first alignment electrode RME1 may be in contact with the first conductive pattern CDP1 through the first electrode contact hole CTD penetrating through the via insulating layer VIA and the circuit protection layer PVX. The second alignment electrode RME2 may be in contact with the second voltage line VL2 through the second electrode contact hole CTS penetrating through the via insulating layer VIA and the circuit protection layer PVX. The first alignment electrode RME1 may be connected (e.g., electrically connected) to the first transistor TR1 through the first conductive pattern CDP1 to receive the first power voltage applied thereto, and the second alignment electrode RME2 may be connected (e.g., electrically connected) to the second voltage line VL2 to receive the second power voltage applied thereto.

The alignment electrodes RME may include a conductive material having high reflectivity. For example, the alignment electrodes RME may include a metal such as silver (Ag), copper (Cu), or aluminum (Al), or may have a structure in which an alloy including aluminum (Al), nickel (Ni), lanthanum (La), or the like and a metal layer such as titanium (Ti), molybdenum (Mo), and niobium (Nb) may be stacked. In some embodiments, the alignment electrodes RME may be formed of a double layer or multiple layers in which an alloy including aluminum (Al) and one or more metal layers made of titanium (Ti), molybdenum (Mo), and niobium (Nb) are stacked.

However, embodiments are not limited thereto, and each of the alignment electrodes RME may further include a transparent conductive material. For example, each of the alignment electrodes RME may include a material such as ITO, IZO, or ITZO. In some embodiments, each of the alignment electrodes RME may have a structure in which a transparent conductive material and a metal layer having high reflectivity are stacked in one or more layers, respectively, or may be formed of a single layer including the transparent conductive material and the metal layer having the high reflectivity. For example, each alignment electrode RME may have a stacked structure such as ITO/Ag/ITO, ITO/Ag/IZO, or ITO/Ag/ITZO/IZO. The alignment electrodes RME may be connected (e.g., electrically connected) to the light emitting element ED and may reflect some of the light emitted from the light emitting element ED in an upper direction of the substrate SUB (e.g., in the third direction DR3).

A first insulating layer PAS1 may be disposed on an entire surface of the display area DA, and may be disposed on the via insulating layer VIA and the alignment electrodes RME. The first insulating layer PAS1 may include an insulating material to protect the alignment electrodes RME and simultaneously insulate different alignment electrodes RME from each other. As the first insulating layer PAS1 covers the alignment electrodes RME before the external bank BNL is formed, the first insulating layer PAS1 may prevent the alignment electrodes RME from being damaged in a process of forming the external bank BNL. For example, the first insulating layer PAS1 may prevent the light emitting element ED disposed on the first insulating layer PAS1 from being damaged by being in contact with (e.g., in direct contact with) other members.

In an embodiment, the first insulating layer PAS1 may have a step formed so that a portion of a top surface thereof may be recessed between the alignment electrodes RME spaced apart from each other in the first direction DR1. The light emitting element ED may be disposed on the top surface of the first insulating layer PAS1 in which the step is formed, and a space may also be formed between the light emitting element ED and the first insulating layer PAS1.

As illustrated in FIG. 7, the first insulating layer PAS1 may include contact portions CT1 and CT2. The contact portions may overlap different alignment electrodes RME, respectively. For example, the contact portions may include first contact portions CT1 disposed to overlap the first alignment electrode RME1, and second contact portions CT2 disposed to overlap the second alignment electrode RME2. The first contact portions CT1 and the second contact portions CT2 may penetrate through the first insulating layer PAS1 to expose a portion of the top surface of the first alignment electrode RME1 or the second alignment electrode RME2 on a lower side thereof. Each of the first contact portion CT1 and the second contact portion CT2 may further penetrate through some of other insulating layers disposed on the first insulating layer PAS1. The alignment electrode RME exposed by each of the contact portions may be in contact with the connection electrode CNE.

The external bank BNL may be disposed on the first insulating layer PAS1. The external bank BNL may include portions extending in the first direction DR1 and the second direction DR2, and surround each of the pixels PX. The external bank BNL may surround each of the pixels PX and may distinguish (or define) the pixels PX, and may surround the outermost portion of the display area DA and may distinguish (or define) the display area DA from the non-display area NDA. For example, the external bank BNL positioned on another side in the first direction DR1 (or disposed in a left side area) may be referred to as a first external bank BNL, and the external bank BNL positioned on a side in the first direction DR1 (or disposed in a right side area) may be referred to as a second external bank BNL.

The light emitting elements ED may be in contact with connection electrodes CNE (e.g., CNE1 and CNE2) to be connected (e.g., electrically connected) to the alignment electrode RME and the circuit layers CCL on a lower side of the via insulating layer VIA, and may receive electrical signals applied thereto to emit light of a specific wavelength band.

The external bank BNL may have a specific height, similarly to the internal bank. In some embodiments, a height of the top surface of the external bank BNL may be higher than a height of the top surface of the internal bank, and a thickness thereof may be equal to or greater than a thickness of the internal bank BP. The external bank BNL may prevent ink from overflowing into adjacent pixels PX in an inkjet printing process of a process of manufacturing the display device 1. The external bank BNL may include an organic insulating material such as polyimide, similarly to the internal bank BP.

The connection electrodes CNE may be disposed on the alignment electrodes RME and the internal banks BP. The first connection electrode CNE1 may be disposed on the first alignment electrode RME1 and the first internal bank BP1. The first connection electrode CNE1 may overlap the first alignment electrode RME1 in the third direction DR3 and may extend beyond the external bank BNL from the light emitting area EMA. The second connection electrode CNE2 may be disposed on the second alignment electrode RME2 and the second internal bank BP2. The second connection electrode CNE2 may overlap the second alignment electrode RME2 in the third direction DR3 and may extend beyond the external bank BNL from the light emitting area EMA.

A width (hereinafter, referred to as a 'thickness') of the first connection electrode CNE1 and the second connection electrode CNE2 in the third direction DR3 may vary according to positions of the first connection electrode CNE1 and the second connection electrode CNE2. For example, as illustrated in FIG. 6, a thickness T2 of the connection electrode CNE at a portion where the external bank BNL may be disposed between the connection electrode CNE and the alignment electrode RME may be smaller than a thickness T1 of the connection electrode CNE at a portion where the external bank BNL is not disposed between the connection electrode CNE and the alignment electrode RME. This may be because a magnetic field formed on the alignment electrode RME is affected by an overlapping relationship between the alignment electrode RME and the external bank BNL according to a process of manufacturing a display device to be described below.

The first connection electrode CNE1 and the second connection electrode CNE2 may be respectively disposed on the first insulating layer PAS1 and may be in contact with the light emitting elements ED. The first connection electrode CNE1 may overlap the first alignment electrode RME1 and may be in contact with an end portion of each of the light emitting elements ED. The second connection electrode CNE2 may overlap the second alignment electrode RME2 and may be in contact with another end portions of the light emitting elements ED. The connection electrodes CNE may be in contact with the light emitting elements ED and may be connected (e.g., electrically connected) to the third conductive layer. The first connection electrode CNE1 may be in contact with first end portions of the light emitting elements ED, and the second connection electrode CNE2 may be in contact with second end portions of the light emitting elements ED.

According to an embodiment, in the display device 1, each of the connection electrodes CNE may be in contact with the alignment electrodes RME through the contact portions CT1 and CT2. For example, the first connection electrode CNE1 may be in contact with the first alignment electrode RME1 through the first contact portion CT1 penetrating through the first insulating layer PAS1. The second connection electrode CNE2 may be in contact with the second alignment electrode RME2 through the second contact portion CT2 penetrating through the first insulating layer PAS1. Each of the connection electrodes CNE may be connected (e.g., electrically connected) to the third conductive layer through each of the alignment electrodes RME. The first connection electrode CNE1 may be connected (e.g., electrically connected) to the first transistor T1 to receive the first power voltage applied thereto, and the second connection electrode CNE2 may be connected (e.g., electrically connected) to the second voltage line VL2 to receive the second power voltage applied thereto. Each of the connection electrodes CNE may be in contact with the light emitting element ED in the light emitting area EMA to transfer the power voltages to the light emitting element ED.

As described above, the connection electrodes CNE may be disposed with maintaining a constant gap from the edge portion of the alignment electrode RME on the alignment electrode RME. For example, as illustrated in FIGS. 5 to 7, the first connection electrode CNE1 may be disposed toward the inside of (the edge portion or the outmost portion of) the first alignment electrode RME1 with maintaining a specific gap from the edge portion of the first alignment electrode RME1. For example, a gap G1, on the first alignment electrode RME1. Likewise, the second connection electrode CNE2 may be disposed toward the inside of (the edge portion or the outmost portion of) the second alignment electrode RME2 with maintaining a specific constant gap from the edge portion of the second alignment electrode RME2 (e.g., a gap G1) on the second alignment electrode RME2. This may be due to a manufacturing method of a display device, which will be described below. A detailed description thereof will be provided below.

As illustrated in FIG. 5, the connection electrodes CNE may include a crosslinking member PL for fixing metal particles CNP by filling spaces between the metal particles CNP. The metal particles CNP may be in contact with (e.g., in direct contact with) each other.

The metal particles CNP may include a magnetic conductive material. For example, the metal particles CNP may include nickel (Ni), cobalt (Co), or the like as a magnetic metal material. In another example, the metal particles CNP may be ionic metal particles that are charged in a second solvent SV2 (see FIG. 13) applied in a process of forming a connection electrode CNE of a manufacturing method of a display device to be described below. A description thereof will be provided below.

The crosslinking member PL may include an organic material. For example, the crosslinking member PL may include an organic material such as propylene glycol (PG) or propylene glycol methyl acetate (PGMA) as the organic material. The crosslinking member may be a result of remaining after the second solvent SV2 (see FIG. 13) applied in the process of forming the connection electrode CNE of the manufacturing method of the display device to be described below is solidified. A description thereof will be provided below.

The second insulating layer PAS2 may be disposed on the first connection electrode CNE1, the second connection electrode CNE2, and the external bank BNL. The second insulating layer PAS2 may insulate the first connection electrode CNE1 and the second connection electrode CNE2 from each other so that the first connection electrode CNE1 may not be in direct contact with the second connection electrode CNE2.

Each of the first insulating layer PAS1 and the second insulating layer PAS2 described above may include an inorganic insulating material. In an embodiment, each of the first insulating layer PAS1 and the second insulating layer PAS2 may be made of any one of silicon oxide ($SiO_x$), silicon nitride ($SiN_x$), and silicon oxynitride ($SiO_xN_y$). The first insulating layer PAS1 and the second insulating layer PAS2 may be made of the same material, may be partially made of the same material and partially made of different materials, or may be made of different materials, respectively.

For example, a color control structure, a color filter, and the like may be further disposed on the second insulating layer PAS2. A detailed description thereof will be omitted.

Hereinafter, a manufacturing method of a display device 1 according to an embodiment will be described.

FIGS. 8 to 17 are schematic views for describing a manufacturing method of a display device according to an embodiment.

Referring to FIGS. 8 to 17, a manufacturing method of a display device 1 according to an embodiment may include a step (S100) of forming an alignment electrode RME on a substrate SUB, a step (S200) of aligning a light emitting element ED on the alignment electrode RME, a step (S300) of applying a second solvent SV2 in which metal particles CNP are dispersed onto the substrate SUB on which the alignment electrode RME and the light emitting element ED are disposed, a step (S400) of aligning the metal particles CNP dispersed in the second solvent SV2 with the alignment electrode RME, and a step (S500) of removing the second solvent SV2.

Figure 9:
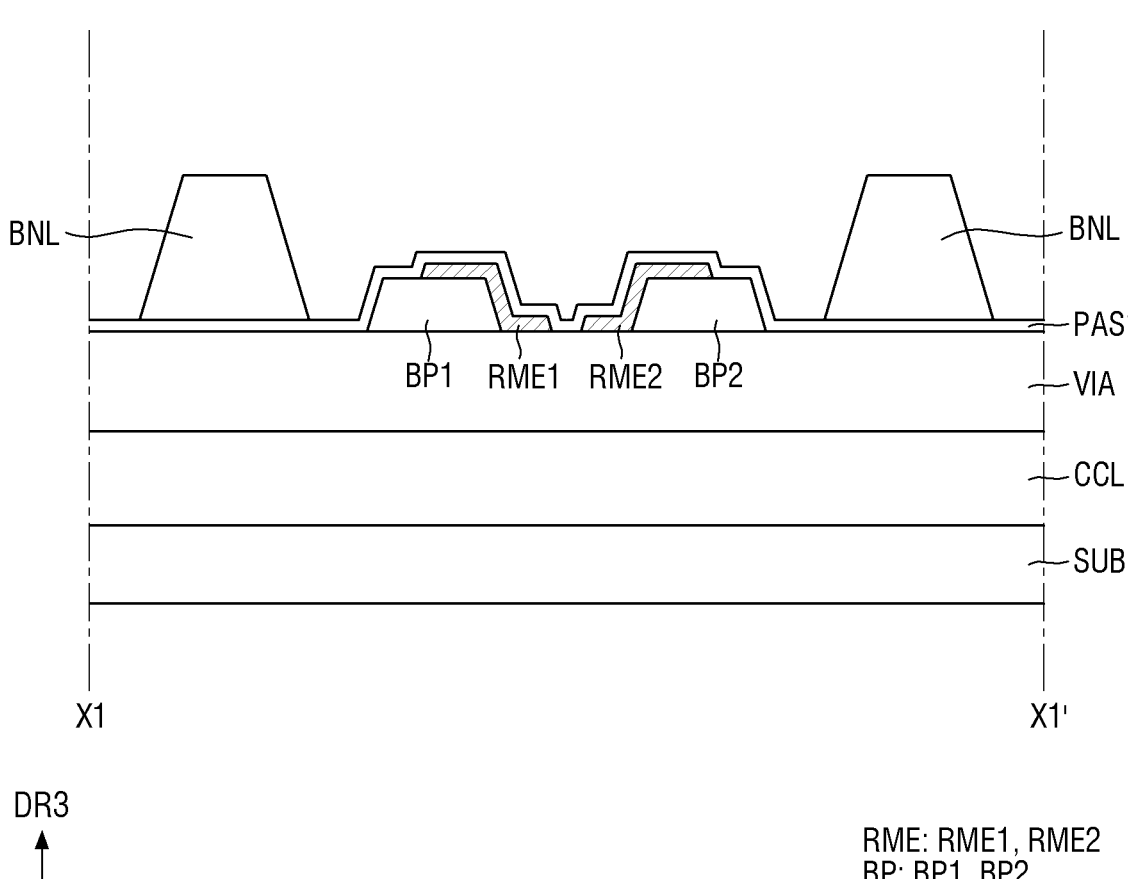

Referring to FIG. 9, an alignment electrode RME may be formed on a substrate SUB (S100). A process of forming the alignment electrode RME may be performed by an etching process by using a mask.

For example, the alignment electrode RME (e.g., a first alignment electrode RME1 and a second alignment electrode RME2) may be formed by sequentially forming a circuit layer CCL, a via insulating layer VIA, an internal bank BP, and an alignment electrode material layer on the substrate SUB, by exposing and developing a photoresist on the alignment electrode material layer to form an etching stop layer, and then by etching the alignment electrode material layer exposed by the etching stop layer.

Thereafter, a first insulating layer PAS1 and an external bank BNL may be sequentially formed on the alignment electrode RME.

Figure 10:
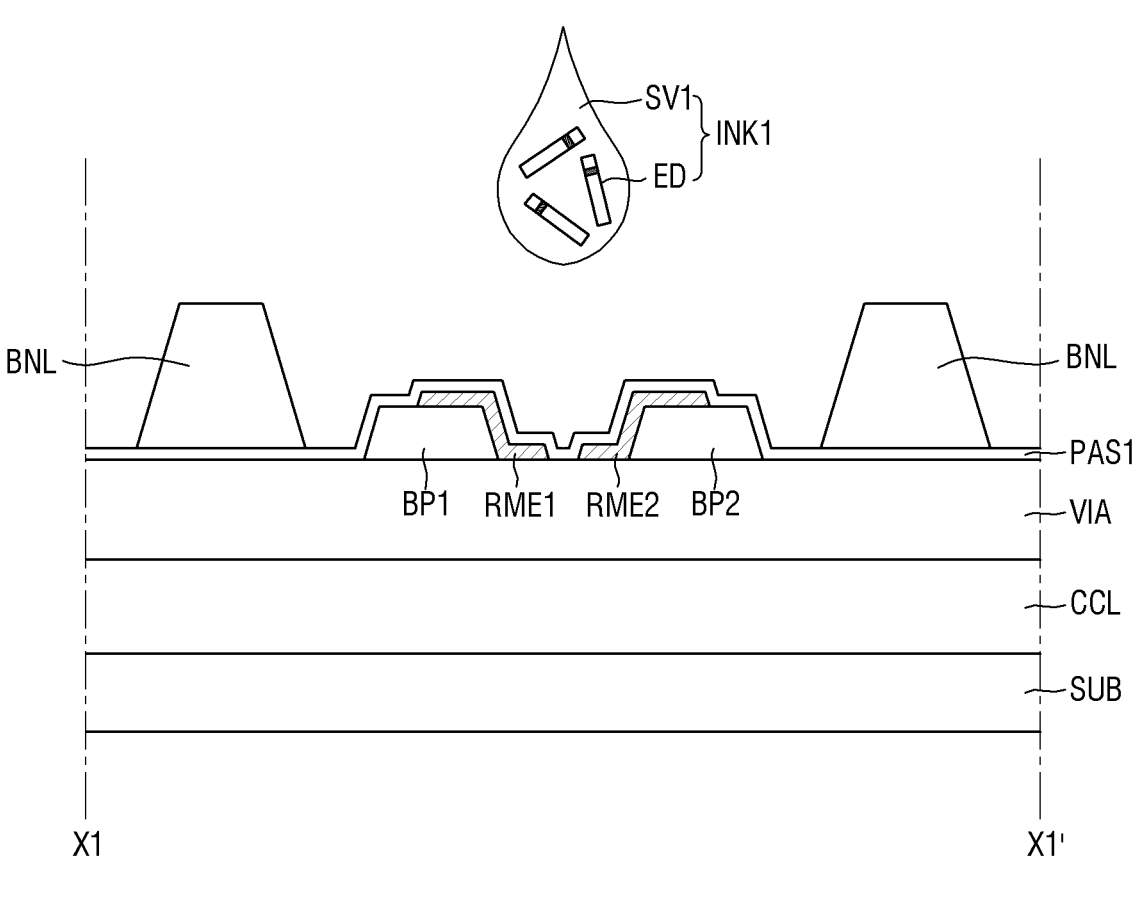
Figure 10:
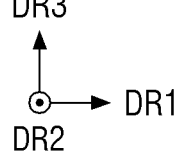
Figure 11:
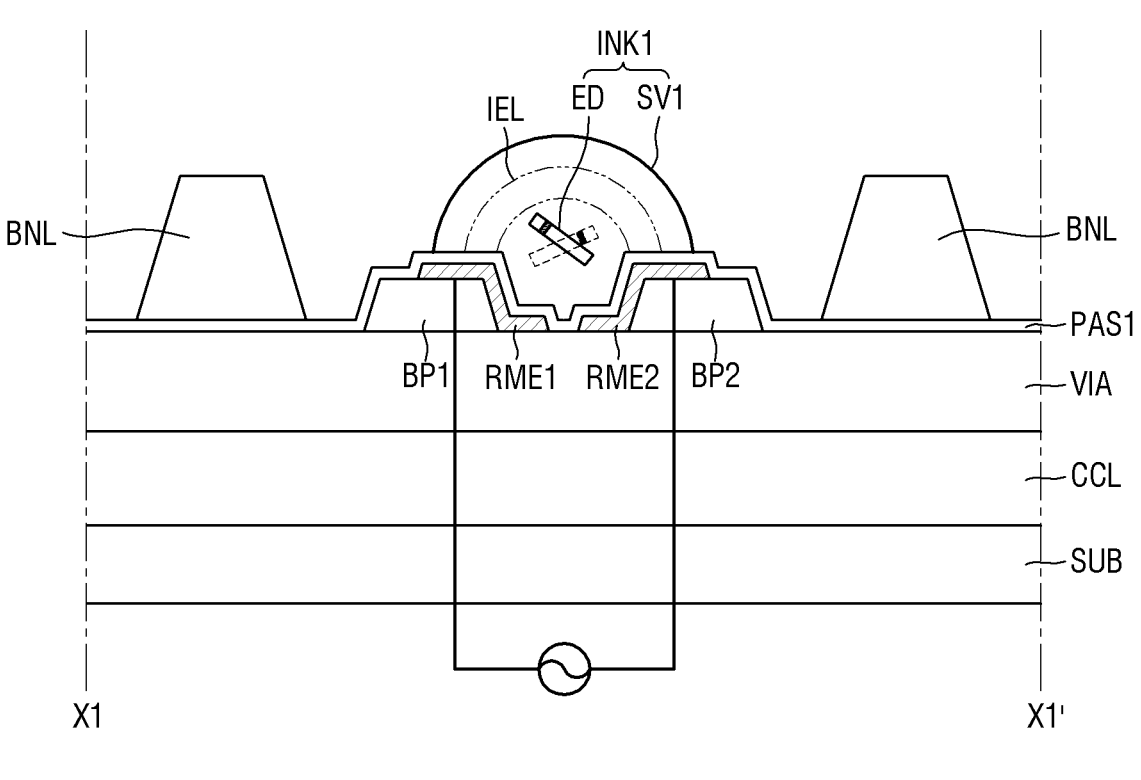
Figure 11:
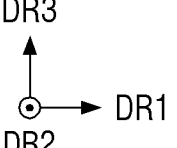
Figure 12:
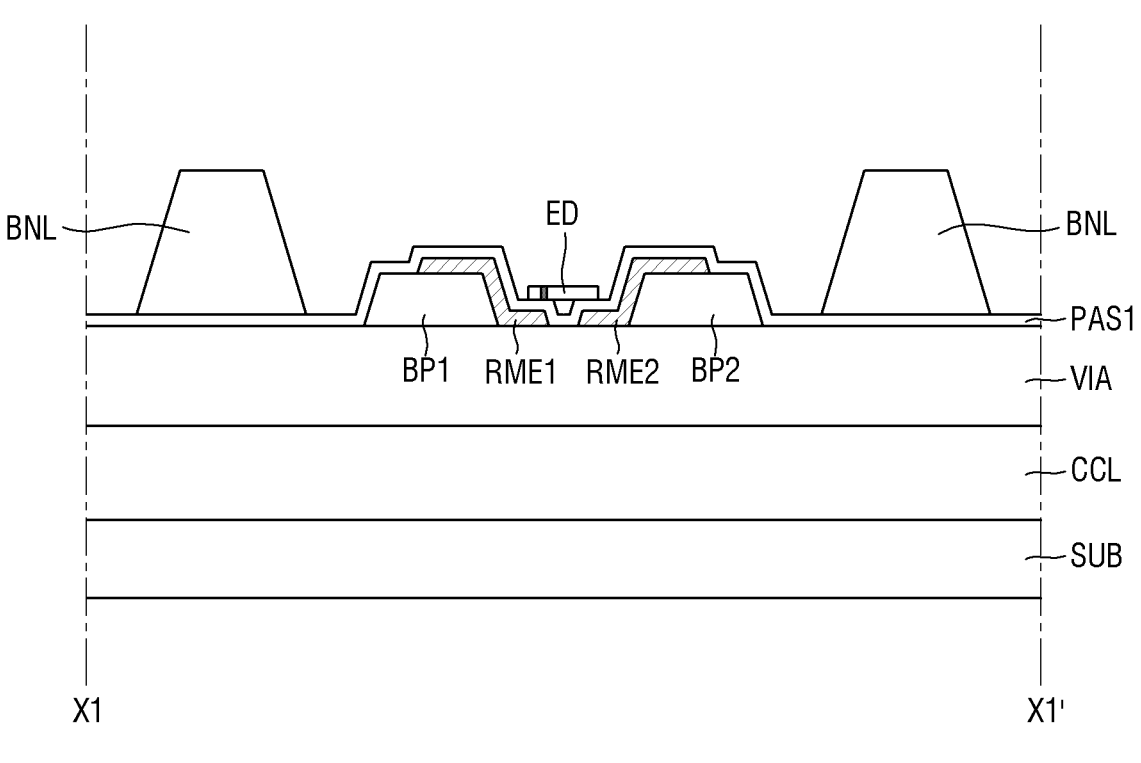
Figure 12:
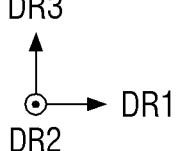

Referring to FIGS. 10 to 12, a light emitting element may be aligned in a separation space disposed between a first internal bank BP1 and a second internal bank BP2 (S200).

For example, a first ink INK1 including a first solvent SV1 and a light emitting element ED dispersed in the first solvent SV1 may be discharged (or injected) in the separation space between the first internal bank BP1 and the second internal bank BP2, and an electric signal may be applied to the first alignment electrode RME1 and the second alignment electrode RME2 to form an electric field IEL in the discharged first ink INK1. For example, a process of discharging the first ink INK1 may be performed by using an ink-jet printing apparatus.

The first solvent SV1 may be acetone, water, alcohol, toluene, propylene glycol (PG), or propylene glycol methyl acetate (PGMA), but embodiments are not limited thereto.

In case that the electric signal is applied to the first alignment electrode RME1 and the second alignment electrode RME2, the electric field IEL may be generated in the first solvent SV1 in which the light emitting element ED is dispersed, and the light emitting element ED may receive a dielectrophoresis (DEP) force by the electric field IEL to change the orientation direction and position thereof and may be seated in the separation space between the first alignment electrode RME1 and the second alignment electrode RME2.

Figure 13:
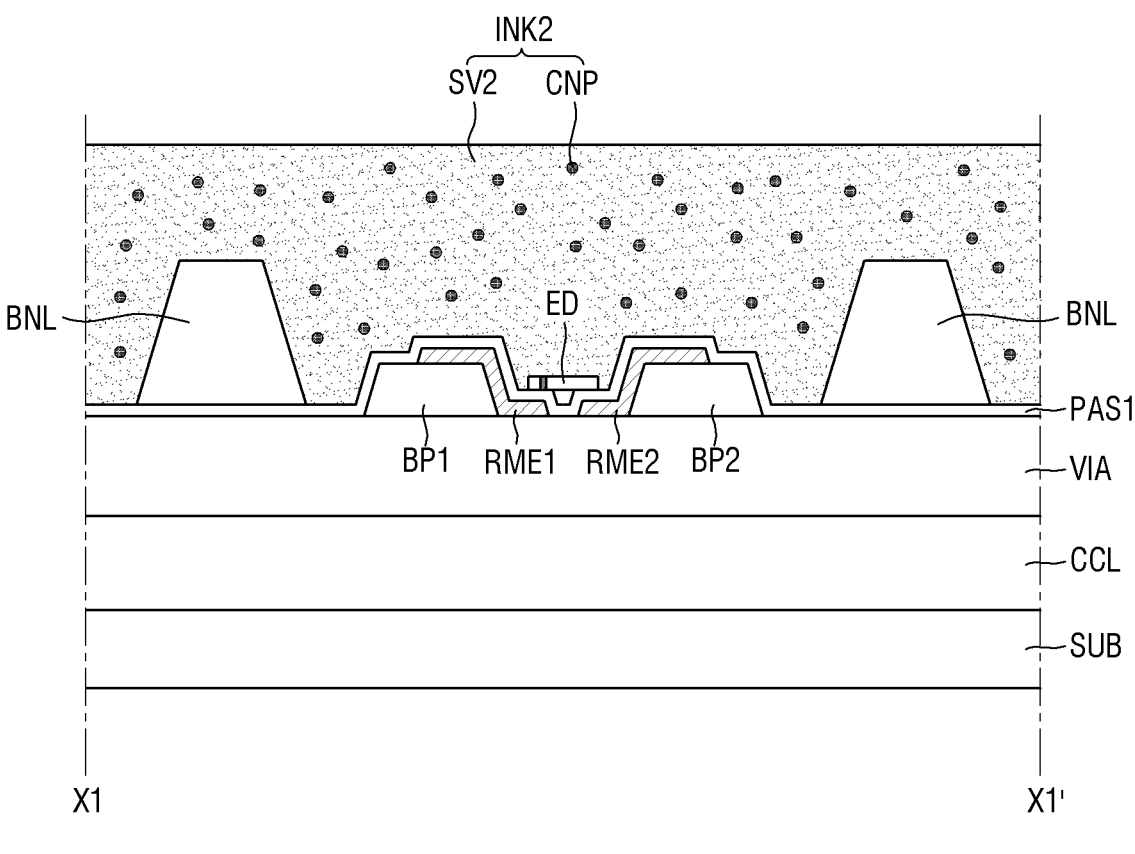
Figure 13:
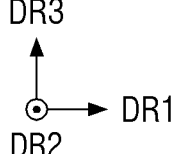

Referring to FIG. 13, a second ink INK2 including a second solvent SV2 and metal particles CNP dispersed in the second solvent SV2 may be applied onto the substrate SUB on which the alignment electrode RME and the light emitting element ED are disposed (S300).

The second ink INK2 may be applied (e.g., entirely applied) onto the display area DA in which the pixels PX are disposed. For example, the second ink INK2 may be entirely applied to the display area DA, and may cover elements disposed on the substrate as illustrated in FIG. 13.

As described above, the metal particles CNP may be a magnetic metal material or an ionic metal particle having an electric charge. The metal particles CNP may be self-aligned on the alignment electrode RME to form a connection electrode CNE, as will be described below.

The second solvent SV2 may be acetone, water, alcohol, toluene, propylene glycol (PG), or propylene glycol methyl acetate (PGMA), but embodiments are not limited thereto.

Figure 14:
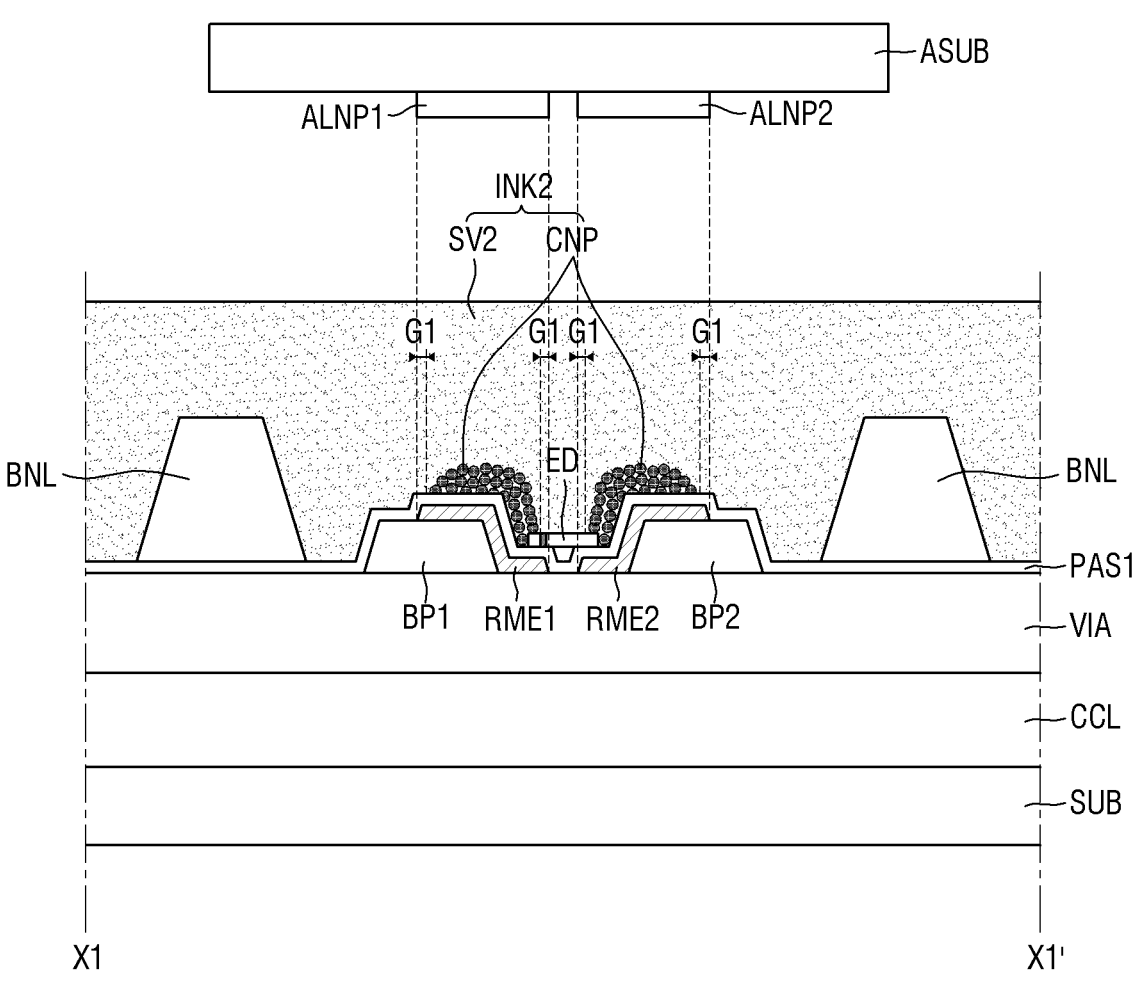
Figure 14:
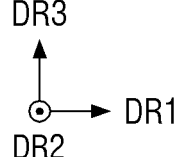
Figure 15:
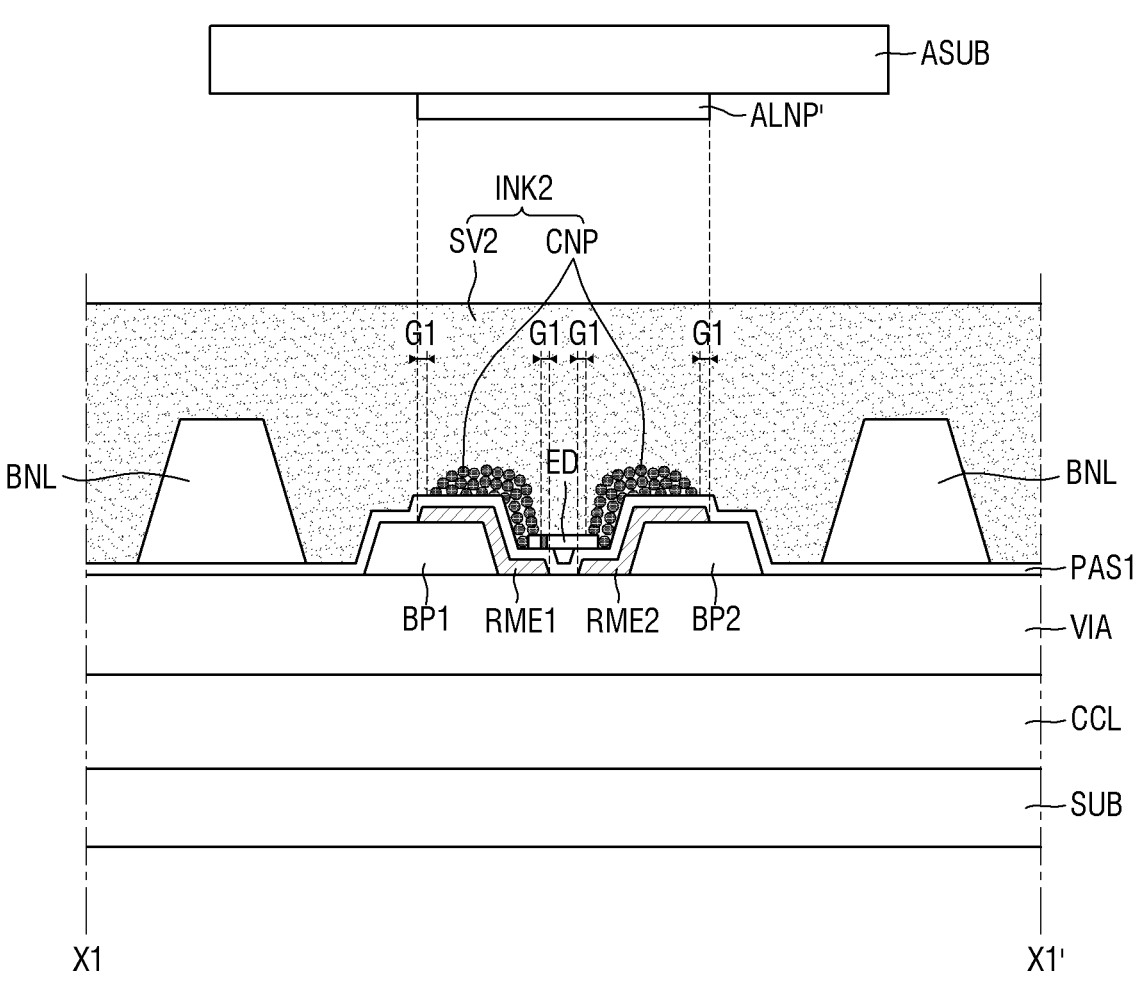
Figure 15:
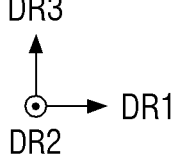

Referring to FIGS. 14 and 15, the metal particles CNP dispersed in the second solvent SV2 may be aligned with the alignment electrode RME (S400). For example, a process of aligning the metal particles CNP with the alignment electrode RME may be performed by using an aligner ALN.

For example, as illustrated in FIG. 14, the aligner ALN may include an alignment substrate ASUB (as base substrate of the aligner ALN) and first and second alignment patterns ALNP1 and ALNP2 disposed on a bottom surface of the alignment electrode ASUB. For example, the aligner ALN and the alignment electrode RME may have substantially the same pattern, e.g., in a plan view.

The first alignment pattern ALNP1 and the first alignment electrode RME1 may have substantially the same profile (or the same shape), e.g., in a plan view. For example, the first alignment pattern ALNP1 and the first alignment electrode RME1 may have the same width in the first direction DR1 and the width in the second direction DR2. For example, the second alignment pattern ALNP2 and the second alignment electrode RME2 may have substantially the same profile (or the same shape) in a plan view, and may have the same width in the first direction DR1 and the width in the second direction DR2.

The first and second alignment patterns ALNP1 and ALNP2 may include magnets. A separate power may be supplied to the first alignment electrode RME1 and the second alignment electrode RME2 so that a current may be applied thereto. For example, the first alignment pattern ALNP1 and the first alignment electrode RME1 may overlap each other in the third direction DR3 to form a magnetic field, and the metal particles CNP may be concentrated (or aggregated) on the first alignment electrode RME1 through the magnetic field. For example, the second alignment pattern ALNP2 and the second alignment electrode RME2 may overlap each other in the third direction DR3 to form a magnetic field, and the metal particles CNP may be concentrated (or aggregated) on the second alignment electrode RME2 through the magnetic field.

In another example, the first and second alignment patterns ALNP1 and ALNP2 may include electrodes through which a current flows. A separate power may be supplied to the first alignment electrode RME1 and the second alignment electrode RME2 so that a current may be applied thereto. For example, the first alignment pattern ALNP1 and the first alignment electrode RME1 may have different charges (or different polarities), and the second alignment pattern ALNP2 and the second alignment electrode RME2 may have different charges (or different polarities). For example, in case that the first alignment pattern ALNP1 has a positive charge, the first alignment electrode RME1 may have a negative charge, and in case that the second alignment pattern ALNP2 has a positive charge, the second alignment electrode RME2 may have a negative charge. Accordingly, the first alignment pattern ALNP1 and the first alignment electrode RME1 may overlap each other in the third direction DR3 to form a magnetic field, and the metal particles CNP may be concentrated (or aggregated) on the first alignment electrode RME1 through the magnetic field. For example, the second alignment pattern ALNP2 and the second alignment electrode RME2 may overlap each other in the third direction DR3 to form a magnetic field, and the metal particles CNP may be concentrated (or aggregated) on the second alignment electrode RME2 through the magnetic field.

As illustrated in FIG. 15, an aligner ALN' may include an alignment pattern ALNP' in the form of a flat plate on which a separate pattern is not formed. For example, as described above, the alignment pattern ALNP' may include a magnet or an electrode, and a magnetic field may be formed in an area overlapping the first alignment electrode RME1 or the second alignment electrode RME2 in the third direction DR3 to align the metal particles CNP on the first alignment electrode RME1 or the second alignment electrode RME2.

The metal particles CNP may be concentrated (or aggregated) from a central portion of the alignment electrode RME to an outer portion thereof. Accordingly, the metal particles CNP may be formed with maintaining a specific gap from an edge portion of the alignment electrode RME.

For example, on the first alignment electrode RME1, the metal particles CNP may be disposed within an edge portion of the first alignment electrode RME1 with maintaining a gap G1 from the edge portion of the first alignment electrode RME1, and on the second alignment electrode RME2, the metal particles CNP may be disposed within an edge portion of the second alignment electrode RME2 with maintaining a gap G1 from the edge portion of the second alignment electrode RME2. The metal particles CNP aligned on the first alignment electrode RME1 may form a first connection electrode CNE1 through a subsequent process, and the metal particles CNP aligned on the second alignment electrode RME2 may form a second connection electrode CNE2 through a subsequent process.

For example, the magnetic field formed between the alignment electrode RME and the alignment pattern ALP may vary according to whether a separate element is disposed on the alignment electrode RME. For example, as illustrated in FIGS. 6 and 7, in case that a separate element such as the external bank BNL may be disposed on the alignment electrode RME, the strength of the magnetic field formed between the alignment electrode RME and the alignment pattern ALP may be weakened, so that the metal particles CNP may be aligned to be relatively small. Accordingly, a thickness of the connection electrode CNE at a portion where the external bank BNL may be disposed between the connection electrode CNE and the alignment electrode RME may be formed to be relatively small.

Figure 16:
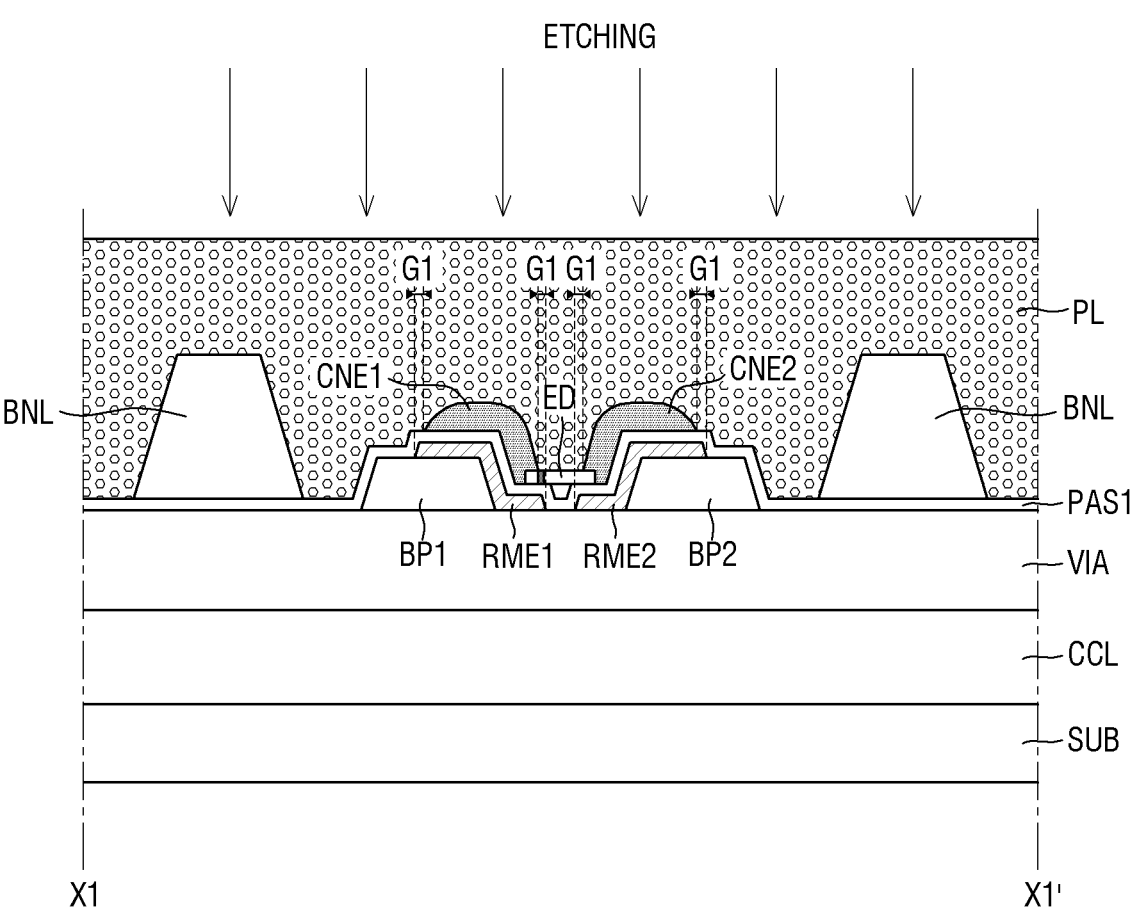
Figure 16:
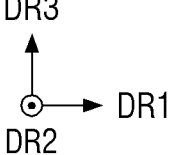
Figure 17:
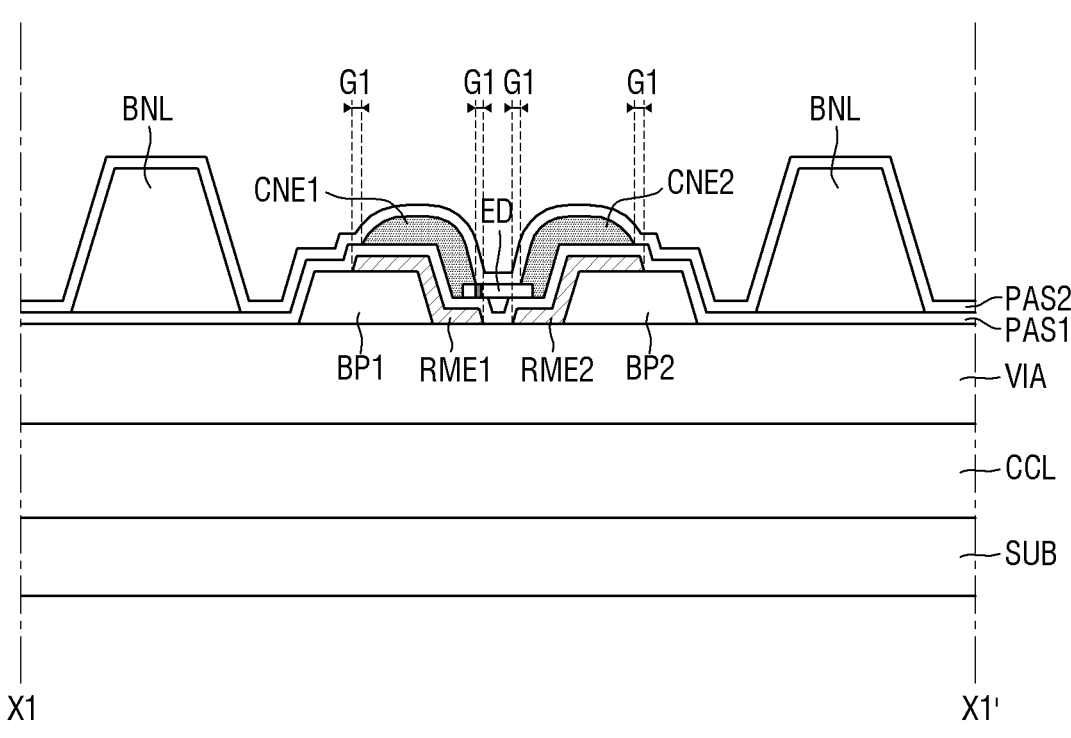
Figure 17:
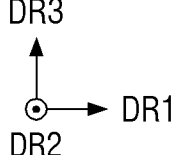

Referring to FIGS. 16 and 17, a first alignment electrode RME1 and a second alignment electrode RME2 may be formed, and the second solvent SV2 may be removed (S500). A process of removing the second solvent SV2 may be performed through a separate etching process after the second solvent SV2 is solidified.

For example, after the metal particles CNP are aligned on the alignment electrode RME, the second solvent SV2 may be solidified to form a crosslinking member PL, and the aligned metal particles CNP may be formed as the connection electrode CNE. For example, as the second solvent SV2 is solidified to form the crosslinking member PL, the metal particles CNP aligned on the first alignment electrode RME1 may be fixed to each other by the crosslinking member PL as illustrated in FIG. 5 to form the first connection electrode CNE1. Likewise, as the second solvent SV2 is solidified to form the crosslinking member PL, the metal particles CNP aligned on the second alignment electrode RME2 may be fixed to each other by the crosslinking member PL as illustrated in FIG. 5 to form the second connection electrode CNE2.

Thereafter, the crosslinking member PL may be etched to expose the external bank BNL, the first insulating layer PAS1, the light emitting element ED, and the connection electrode CNE, and a second insulating layer PAS2 may be formed on the external bank BNL, the first insulating layer PAS1, the light emitting element ED, and the connection electrode CNE.

In this way, by self-aligning the metal particles CNP on the alignment electrode RME to form the connection electrode CNE, a separate mask may not be used to form the connection electrode CNE. Therefore, since the connection electrode CNE is not formed by using the mask, there is no need to consider a processing tolerance due to a process by using the mask. As a result, the structure of the display device may be simplified and processability thereof may be improved.

Hereinafter, another example of the display device 1 according to an embodiment will be described. In the following embodiments, the same components as those of the above-described embodiment will be denoted by the same reference numerals, and an overlapping description thereof will be omitted or simplified and differences will be described for descriptive convenience.

Figure 18:
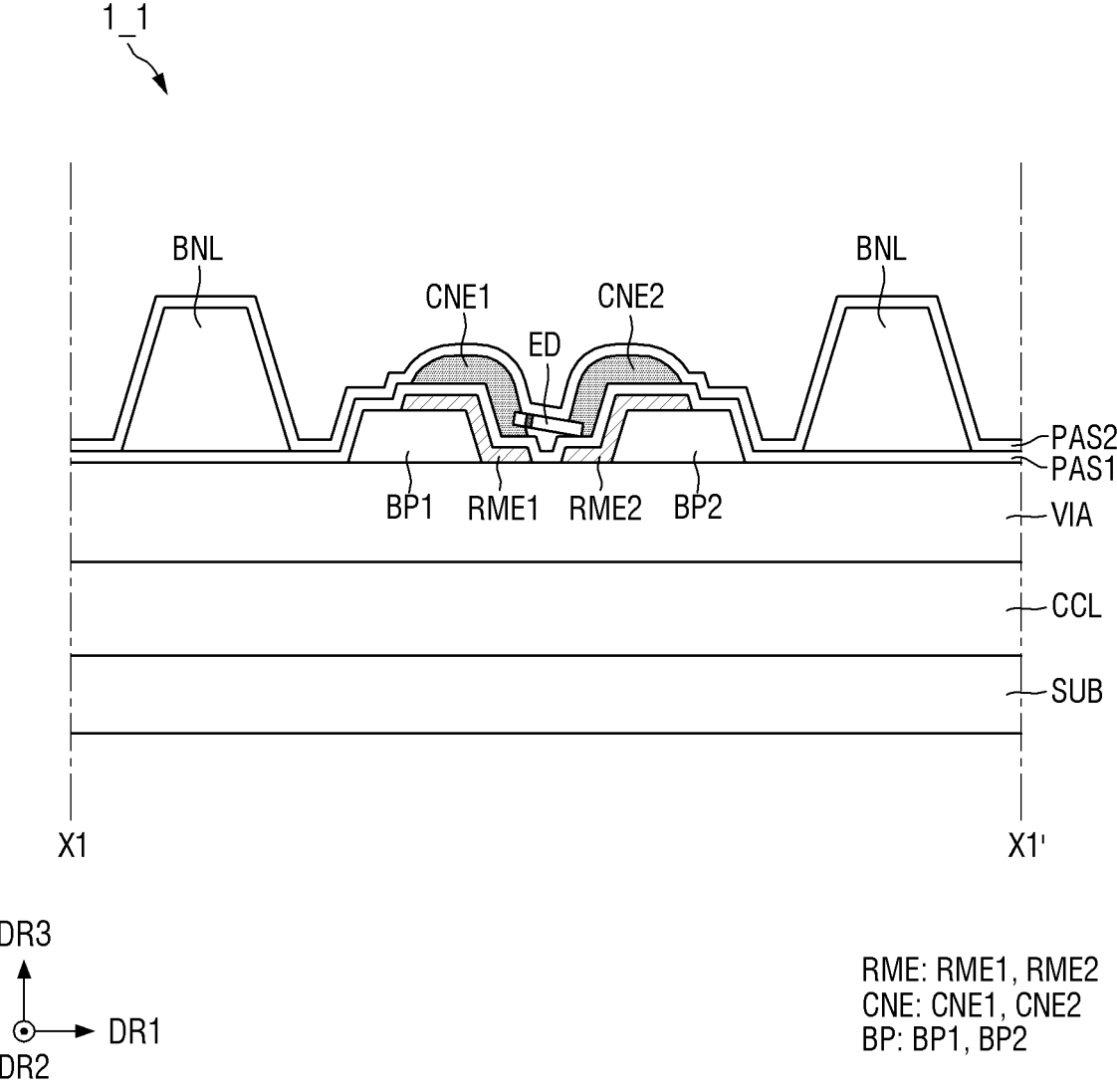
FIG. 18 is a schematic structural view illustrating a structure of a display device according to an embodiment.

FIG. 18 is a schematic structural view illustrating a structure of a display device according to an embodiment.

Referring to FIG. 18, a display device 1_1 according to an embodiment may include a light emitting element ED that may be obliquely aligned. This may be because the light emitting element ED is not normally aligned in the above-described manufacturing method of the display device 1.

Due to factors such as an eddy in the first ink INK1 and instability of the electric field IEL in the process in which the light emitting element ED is aligned, the light emitting element ED may not be normally aligned as illustrated in FIG. 5, but may be aligned obliquely to a side as illustrated in FIG. 18.

For example, in case that the connection electrode CNE is formed by self-aligning the metal particles CNP as described above, the connection electrode CNE may be formed regardless of an arrangement structure of the light emitting element ED in case that the light emitting element ED is aligned obliquely to a side. As a result, the first connection electrode CNE1 and the second connection electrode CNE2 may be stably in contact with an end portion and another end portion of the light emitting element ED.

Accordingly, although the light emitting element ED is aligned obliquely to a side, the contact of the light emitting element ED may be ensured by forming the connection electrode CNE, which is formed by self-aligning the metal particles CNP as described above, and thus device reliability may be improved.

Figure 19:
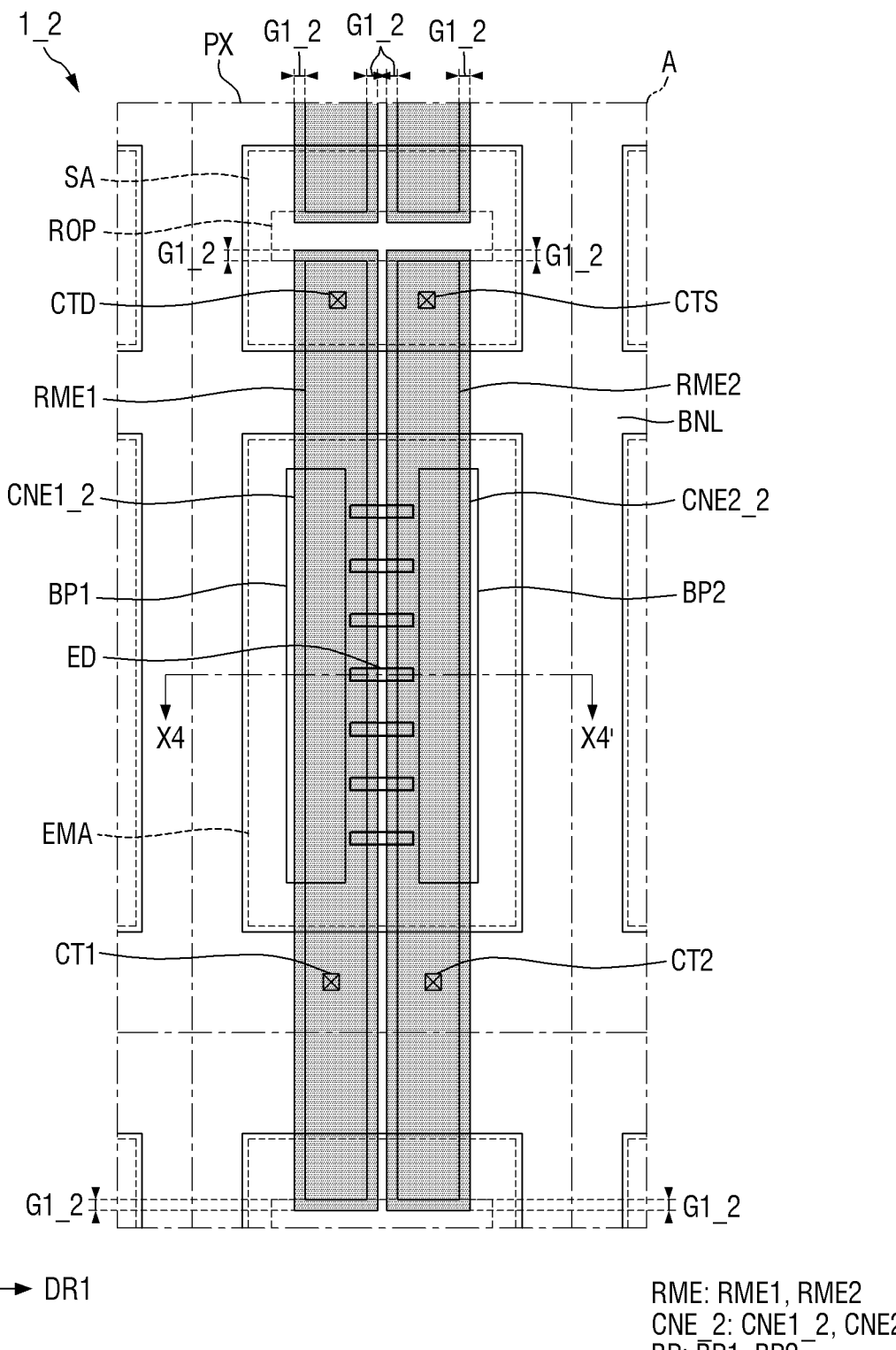
FIG. 19 is a schematic layout view illustrating a pixel structure of a display device according to an embodiment.
Figure 20:
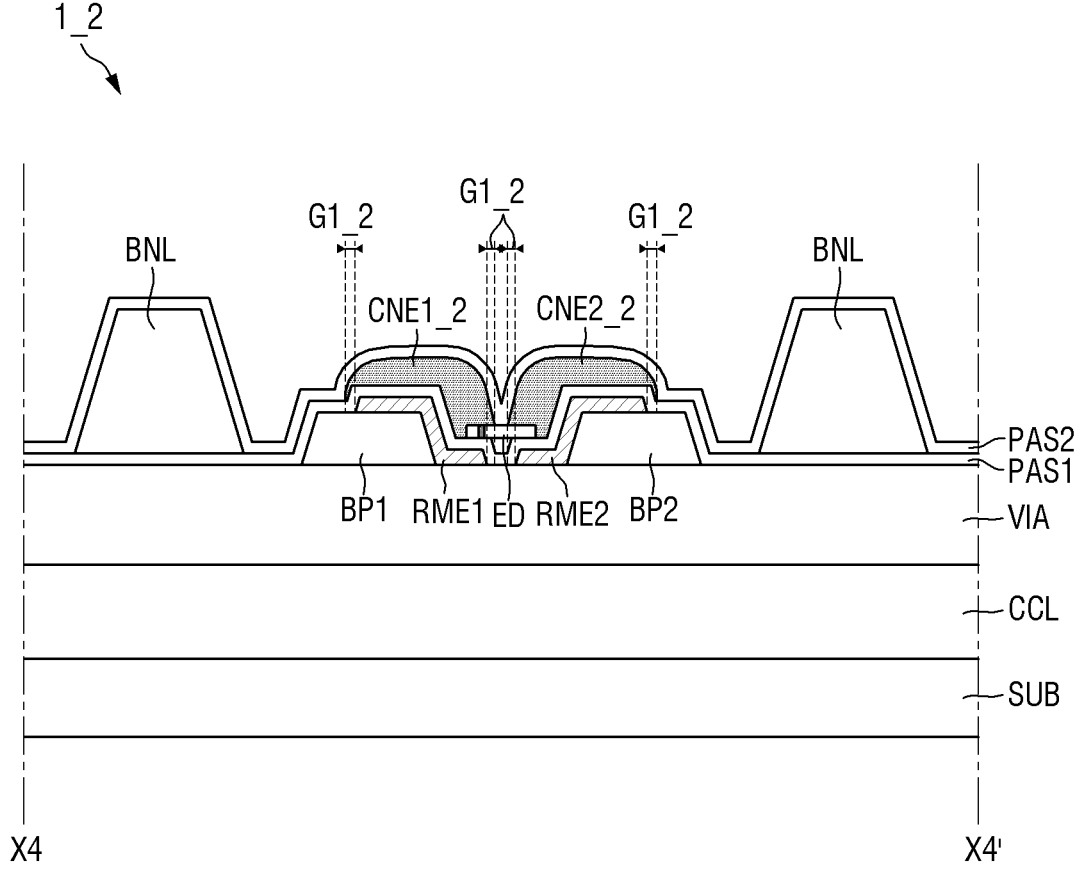
FIG. 20 is a schematic cross-sectional view illustrating a cross section taken along line X4-X4' of FIG. 19.
Figure 20:
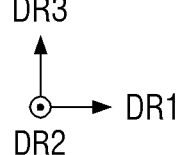

FIG. 19 is a schematic layout view illustrating a pixel structure of a display device according to an embodiment. FIG. 20 is a schematic cross-sectional view illustrating a cross section taken along line X4-X4' of FIG. 19.

Referring to FIGS. 19 and 20, in a display device 1_2 according to an embodiment, the edge portion of the alignment electrode RME may be disposed within an edge portion of a connection electrode CNE_2 in a plan view with maintaining a specific gap. For example, a planar area of the connection electrode CNE_2 may be substantially equal to or smaller than a planar area of the alignment electrode RME, e.g., in a plan view.

As illustrated in FIG. 19, an edge portion of a first connection electrode CNE1_2 may be spaced apart from the edge portion of the first alignment electrode RME1 to the outside of the first alignment electrode RME1 with maintaining a specific gap in a plan view. For example, a side surface of the first connection electrode CNE1_2 in the first direction DR1 may be spaced apart from a side surface of the first alignment electrode RME1 in the first direction DR1 by a gap G1 toward a side in the first direction DR1, another side surface of the first connection electrode CNE1_2 in the first direction DR1 may be spaced apart from another side surface of the first alignment electrode RME1 in the first direction DR1 by the gap G1 toward another side in the first direction DR1, a side surface of the first connection electrode CNE1_2 in the second direction DR2 may be spaced apart from a side surface of the first alignment electrode RME1 in the second direction DR2 by the gap G1 toward a side in the second direction DR2, and another side surface of the first connection electrode CNE1_2 in the second direction DR2 may be spaced apart from another side surface of the first alignment electrode RME1 in the second direction DR2 by the gap G1 toward another side in the second direction DR2.

As illustrated in FIG. 19, an edge portion of a second connection electrode CNE2_2 may be spaced apart from the edge portion of the second alignment electrode RME2 to the inside of the second alignment electrode RME2 with maintaining a specific gap in a plan view. For example, a side surface of the second connection electrode CNE2_2 in the first direction DR1 may be spaced apart from a side surface of the second alignment electrode RME2 in the first direction DR1 by a gap G1 toward a side in the first direction DR1, another side surface of the second connection electrode CNE2_2 in the first direction DR1 may be spaced apart from another side surface of the second alignment electrode RME2 in the first direction DR1 by the gap G1 toward another side in the first direction DR1, a side surface of the second connection electrode CNE2_2 in the second direction DR2 may be spaced apart from a side surface of the second alignment electrode RME2 in the second direction DR2 by the gap G1 toward a side in the second direction DR2, and another side surface of the second connection electrode CNE2 in the second direction DR2 may be spaced apart from another side surface of the second alignment electrode RME2 in the second direction DR2 by the gap G1 toward another side in the second direction DR2.

By the above-described configuration, the connection electrode CNE_2 may be in more stable contact with the light emitting element ED.

Figure 21:
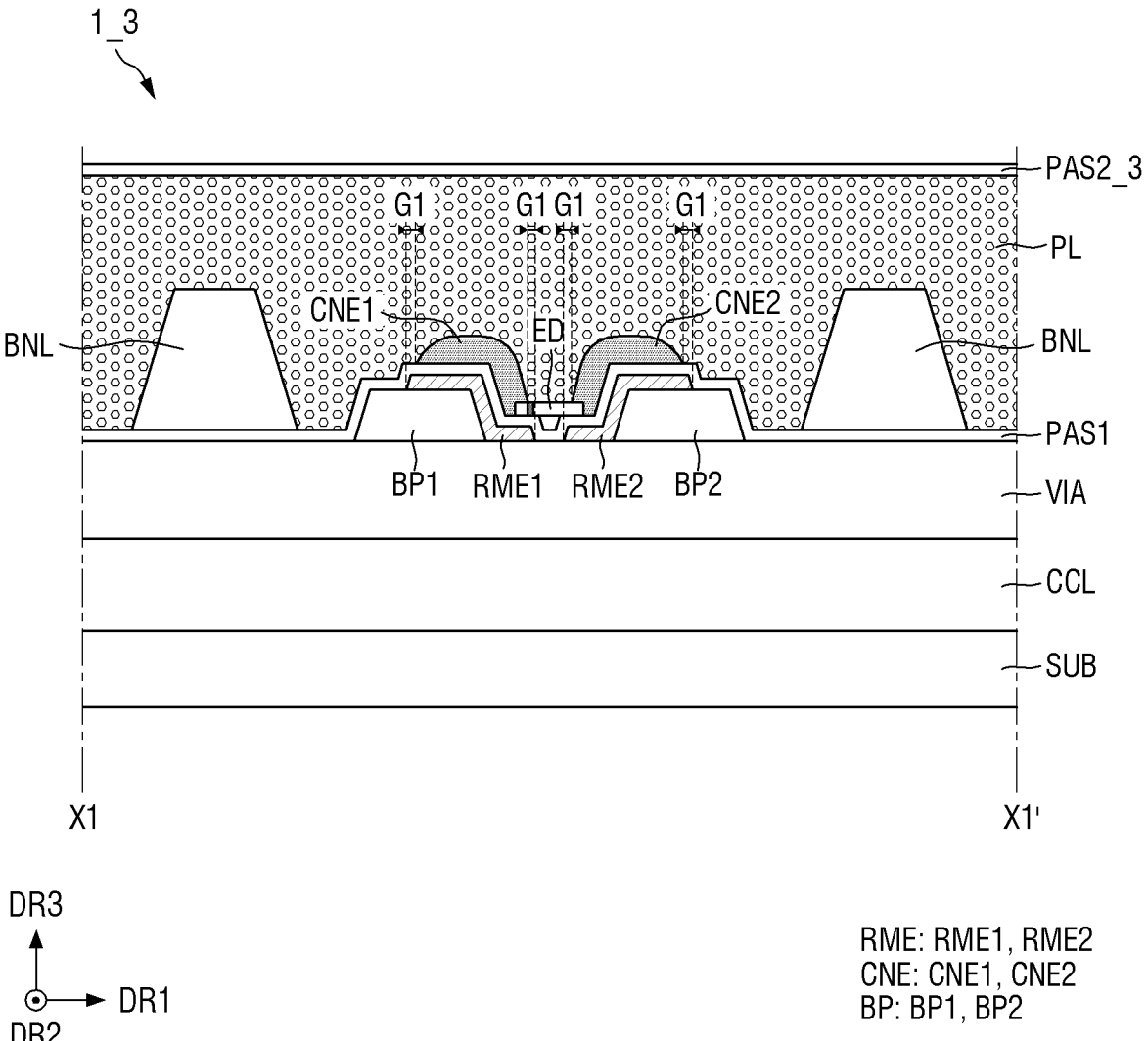
FIG. 21 is a schematic structural view illustrating a structure of a display device according to an embodiment.

FIG. 21 is a schematic structural view illustrating a structure of a display device according to an embodiment.

Referring to FIG. 21, in a display device 1_3 according to an embodiment, a crosslinking member PL may be disposed between the external bank BNL, the first insulating layer PAS1, the connection electrode CNE, and the light emitting element ED and a second insulating layer PAS2_3. The crosslinking member PL may be formed by solidifying the second solvent SV2 in the manufacturing method of the display device 1 described above, and may remain on (e.g., directly on) the top surfaces of the external bank BNL, the first insulating layer PAS1, the connection electrode CNE, and the light emitting element ED because a separate etching process is not performed after the second solvent SV2 is solidified. In an embodiment, the crosslinking member PL may be referred to as an organic material layer.

The crosslinking member PL may include propylene glycol (PG) or propylene glycol methyl acetate (PGMA), or the like as an organic material as described above. According to the configuration as described above, the display device 1_3 according to an embodiment may protect the light emitting element ED or other elements from external impact.

Figure 22:
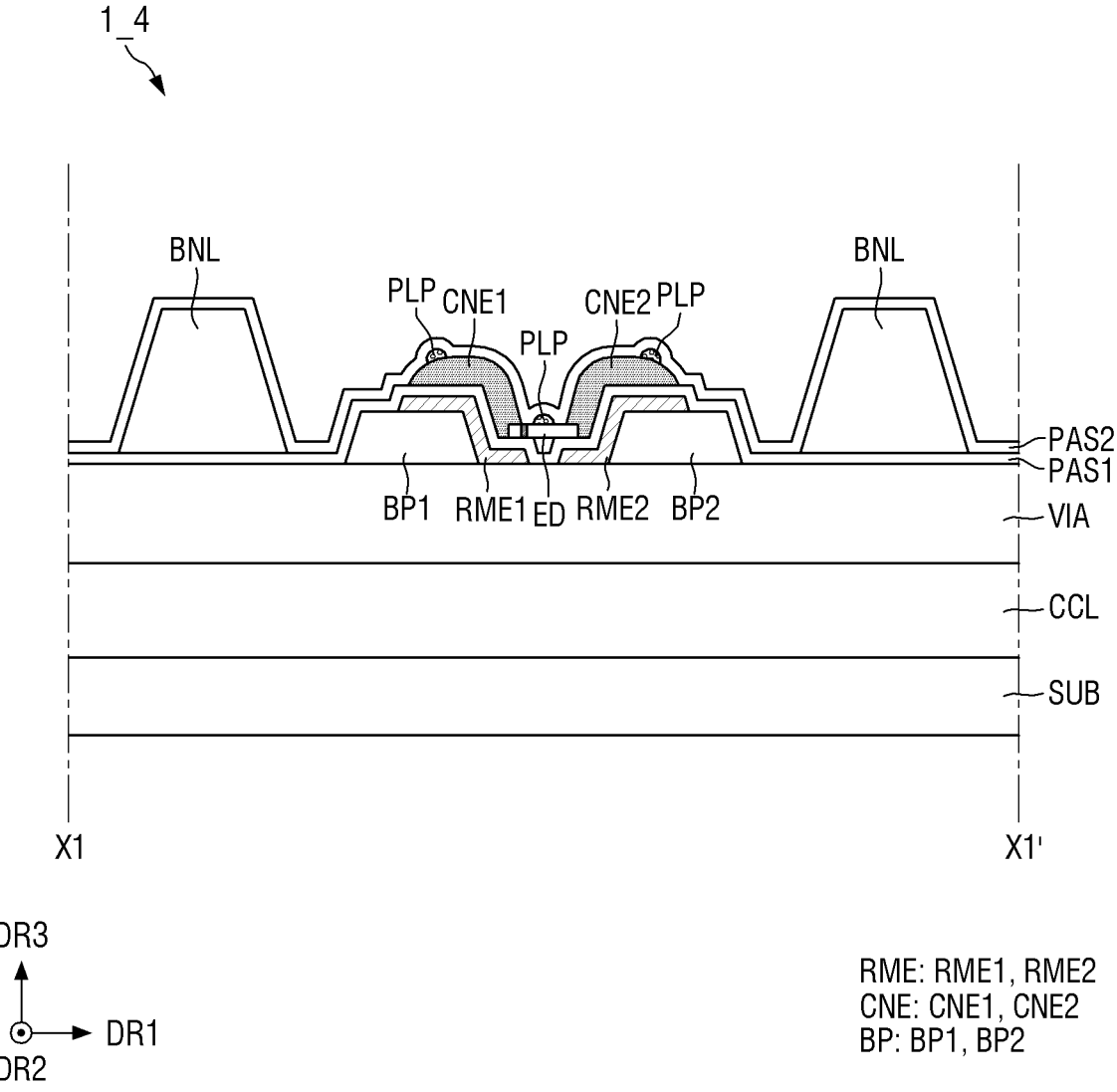
FIG. 22 is a schematic structural view illustrating a structure of a display device according to an embodiment.

FIG. 22 is a schematic structural view illustrating a structure of a display device according to an embodiment.

Referring to FIG. 22, in a display device 1_4 according to an embodiment, an organic material pattern PLP may be disposed on (e.g., directly on) a top surface of at least one of the first connection electrode CNE1, the second connection electrode CNE2, and the light emitting element ED. The organic material pattern PLP may remain without being completely etched in solidifying the second solvent SV2 in the above-described manufacturing method of the display device 1. For example, the organic material pattern PLP and the crosslinking member PL may include the same material. In an embodiment, the organic material pattern PLP may be referred to as an organic material layer.

Organic material patterns PLP may be spaced apart from each other. For example, each of the organic material patterns PLP may be disposed on the top surface of each of the elements disposed under the organic material pattern PLP, for example, the first connection electrode CNE1, the second connection electrode CNE2, and the light emitting element ED, respectively.

The organic material pattern PLP may cover a portion of any one of the top surfaces of the first connection electrode CNE1, the second connection electrode CNE2, and the light emitting element ED. Accordingly, the organic material pattern PLP may be disposed on a portion between the first connection electrode CNE1 and the second insulating layer PAS2, and the organic material pattern PLP may not be disposed on another portion between the first connection electrode CNE1 and the second insulating layer PAS2, so that the first connection electrode CNE1 and the second insulating layer PAS2 may be in contact with (e.g., in direct contact with) each other. For example, the organic material pattern PLP may be disposed on a portion between the second connection electrode CNE2 and the second insulating layer PAS2, and the organic material pattern PLP may not be disposed on another portion between the second connection electrode CNE2 and the second insulating layer PAS2, so that the second connection electrode CNE2 and the second insulating layer PAS2 may be in contact with (e.g., in direct contact with) each other. For example, the organic material pattern PLP may be disposed on a portion between the light emitting element ED and the second insulating layer PAS2, and the organic material pattern PLP may not be disposed on another portion between the light emitting element ED and the second insulating layer PAS2, so that the light emitting element ED and the second insulating layer PAS2 may be in contact with (e.g., in direct contact with) each other.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
a substrate;
a plurality of first internal banks disposed on the substrate and having an inclined side surface and a top surface;
a plurality of second internal banks disposed on the substrate, having an inclined side surface and a top surface, and spaced apart from the plurality of first internal banks, respectively;
a plurality of first alignment electrodes respectively disposed on the plurality of first internal banks;
a plurality of second alignment electrodes respectively disposed on the plurality of first internal banks and spaced apart from the plurality of first alignment electrodes, respectively;
a plurality of light emitting elements disposed between the plurality of first alignment electrodes and the plurality of second alignment electrodes;
a plurality of first connection electrodes in contact with first end portions of the plurality of light emitting elements, the plurality of first connection electrodes overlapping the plurality of first alignment electrodes, respectively;
a plurality of second connection electrodes in contact with second end portions of the plurality of light emitting elements, the plurality of second connection electrodes overlapping the plurality of second alignment electrodes, respectively, and spaced apart from the plurality of first connection electrodes, respectively; and
an insulating layer disposed between portions of the plurality of first connection electrodes which overlap the top surfaces of the plurality of the first internal banks and portions of the plurality of first alignment electrodes which overlap the top surfaces of the plurality of the first internal banks, wherein
each of the plurality of first connection electrodes has a first edge overlapping a corresponding one of the plurality of light emitting elements and a second edge opposite to the first edge thereof in a plan view,
each of the plurality of second connection electrodes has a first edge overlapping a corresponding one of the plurality of light emitting elements and a second edge opposite to the first edge thereof in a plan view,
the first and second edges of each of the plurality of first connection electrodes in a plan view are disposed inwardly from an edge of each of the plurality of first alignment electrodes, respectively, in a plan view, and
the first and second edges of each of the plurality of second connection electrodes in a plan view are disposed inwardly from an edge of each of the plurality of second alignment electrodes, respectively, in a plan view.

2. The display device of claim 1, wherein
adjacent first alignment electrodes among the plurality of first alignment electrodes are spaced apart from each other by a separation portion, and
adjacent first connection electrodes among the plurality of first connection electrodes are spaced apart from each other by the separation portion.

3. The display device of claim 2, wherein the first and second edges of each of the plurality of first alignment electrodes are spaced apart from the edge of each of the plurality of first connection electrodes by a first gap.

4. The display device of claim 3, wherein adjacent second alignment electrodes among the plurality of second alignment electrodes are spaced apart from each other by the separation portion, and adjacent second connection electrodes among the plurality of second connection electrodes are spaced apart from each other by the separation portion.

5. The display device of claim 4, wherein the first and second edges of each of the plurality of second alignment electrodes is spaced apart from the edge of each of the plurality of second connection electrodes by a second gap having a same size, in a plan view, as the first gap.

6. The display device of claim 5, wherein each of the plurality of first connection electrodes and the plurality of second connection electrodes includes a plurality of metal particles and a crosslinking member disposed between the plurality of metal particles.

7. The display device of claim 6, wherein the plurality of metal particles have magnetism.

8. The display device of claim 2, wherein a planar area of each of the plurality of first connection electrodes is smaller than a planar area of the corresponding one of the plurality of first alignment electrodes in a plan view.

* * * * *